(12) United States Patent
van de Ven et al.

(10) Patent No.: US 9,991,427 B2
(45) Date of Patent: Jun. 5, 2018

(54) PHOTONIC CRYSTAL PHOSPHOR LIGHT CONVERSION STRUCTURES FOR LIGHT EMITTING DEVICES

(75) Inventors: Antony P. van de Ven, Hong Kong (HK); Gerald H. Negley, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 483 days.

(21) Appl. No.: 12/719,297

(22) Filed: Mar. 8, 2010

(65) Prior Publication Data

US 2011/0215355 A1    Sep. 8, 2011

(51) Int. Cl.
*H01L 33/50* (2010.01)
*H05B 33/14* (2006.01)

(52) U.S. Cl.
CPC ........... *H01L 33/505* (2013.01); *H05B 33/14* (2013.01); *H01L 33/504* (2013.01); *H01L 2224/48091* (2013.01); *H01L 2224/73265* (2013.01); *H01L 2933/0083* (2013.01)

(58) Field of Classification Search
CPC ........................................ H01L 33/50–33/508
USPC .................................................. 257/E33.061
See application file for complete search history.

(56) References Cited

U.S. PATENT DOCUMENTS

| | | | |
|---|---|---|---|
| 6,476,409 B2 * | 11/2002 | Iwasaki et al. | 257/13 |
| 6,667,574 B2 | 12/2003 | Aoki et al. | |
| 6,740,906 B2 | 5/2004 | Slater et al. | |
| 6,785,454 B2 * | 8/2004 | Abe | 385/123 |
| 6,791,119 B2 | 9/2004 | Slater et al. | |
| 6,853,010 B2 | 2/2005 | Slater et al. | |
| 6,885,033 B2 | 4/2005 | Andrews | |
| 6,888,167 B2 | 5/2005 | Slater et al. | |
| 6,999,669 B2 | 2/2006 | Summers et al. | |
| 7,026,659 B2 | 4/2006 | Slater et al. | |
| 7,029,935 B2 | 4/2006 | Negley et al. | |
| 7,034,328 B2 | 4/2006 | Doverspike et al. | |

(Continued)

FOREIGN PATENT DOCUMENTS

| | | |
|---|---|---|
| EP | 1555307 A2 | 7/2005 |
| EP | 1696016 A1 | 8/2006 |

(Continued)

OTHER PUBLICATIONS

Pan et al. "Tailored photoluminescence of YAG:Ce phosphor through various methods", *Science Direct. Journal of Physics and Chemistry of Solids* 65:5:845 (2004).

(Continued)

*Primary Examiner* — Stephen W Smoot
*Assistant Examiner* — Sun M King
(74) *Attorney, Agent, or Firm* — Myers Bigel, P.A.

(57) ABSTRACT

Solid state light emitting devices include a solid state light emitting die and a photonic crystal phosphor light conversion structure. The photonic crystal phosphor light conversion structure may include a solid phosphor layer that includes dielectric nanostructures therein and may be on a light emitting surface of the solid state light emitting die. The photonic crystal phosphor light conversion structure may be attached to the light emitting surface of the solid state light emitting die via an adhesive layer. The photonic crystal phosphor light conversion structure may also be directly on a light emitting surface of the solid state light emitting die. Related methods are also disclosed.

26 Claims, 15 Drawing Sheets

(56) References Cited

U.S. PATENT DOCUMENTS

| | | | |
|---|---|---|---|
| 7,037,742 | B2 | 5/2006 | Slater et al. |
| 7,042,020 | B2 | 5/2006 | Negley |
| 7,084,436 | B2 | 8/2006 | DenBaars et al. |
| 7,087,936 | B2 | 8/2006 | Negley |
| 7,118,262 | B2 | 10/2006 | Negley |
| 7,125,737 | B2 | 10/2006 | Edmond et al. |
| 7,170,097 | B2 | 1/2007 | Edmond et al. |
| 7,183,587 | B2 | 2/2007 | Negley et al. |
| 7,211,833 | B2 | 5/2007 | Slater et al. |
| 7,362,943 | B2 * | 4/2008 | Ouderkirk ............ B82Y 20/00 385/131 |
| 7,517,728 | B2 | 4/2009 | Leung et al. |
| 7,614,759 | B2 | 11/2009 | Negley |
| 2004/0062699 | A1 | 4/2004 | Oshio |
| 2004/0150979 | A1 * | 8/2004 | Lambertini ............ B82Y 20/00 362/629 |
| 2005/0051789 | A1 | 3/2005 | Negley et al. |
| 2005/0051790 | A1 | 3/2005 | Ueda |
| 2005/0099808 | A1 * | 5/2005 | Cheng et al. ................ 362/231 |
| 2005/0212405 | A1 | 9/2005 | Negley |
| 2005/0220402 | A1 * | 10/2005 | Takagi et al. ................ 385/31 |
| 2006/0018122 | A1 | 1/2006 | Negley |
| 2006/0054076 | A1 | 3/2006 | Dwilinski et al. |
| 2006/0061259 | A1 | 3/2006 | Negley |
| 2006/0076569 | A1 | 4/2006 | Otsuka et al. |
| 2006/0097385 | A1 | 5/2006 | Negley |
| 2006/0124953 | A1 | 6/2006 | Negley et al. |
| 2006/0139945 | A1 | 6/2006 | Negley et al. |
| 2006/0284190 | A1 | 10/2006 | Zimmerman et al. |
| 2007/0075629 | A1 | 4/2007 | Le Toquin et al. |
| 2007/0085100 | A1 * | 4/2007 | Diana et al. .................... 257/98 |
| 2007/0115662 | A1 | 5/2007 | Roberts et al. |
| 2007/0247414 | A1 | 10/2007 | Roberts |
| 2007/0267646 | A1 * | 11/2007 | Wierer et al. ......... 257/E33.061 |
| 2008/0283864 | A1 | 11/2008 | Letoquin et al. |
| 2009/0050905 | A1 * | 2/2009 | Abu-Ageel .................... 257/80 |
| 2009/0127567 | A1 | 5/2009 | Wang |
| 2009/0200561 | A1 | 8/2009 | Burrell et al. |
| 2009/0236621 | A1 | 9/2009 | Chakraborty |
| 2010/0123386 | A1 * | 5/2010 | Chen ............................ 313/502 |

FOREIGN PATENT DOCUMENTS

| | | |
|---|---|---|
| TW | 595018 B | 6/2004 |
| TW | 2006 24718 A | 7/2006 |
| WO | WO 2005/025831 A1 | 3/2005 |
| WO | WO 2006/073141 A1 | 7/2006 |

OTHER PUBLICATIONS

Mikami et al. "New Phosphors for White LEDs: Material Design Concepts" 2009 IOP conference Series: Materials Science and Engineering 1. (2009).

International Search Report and Written Opinion corresponding to International Application No. PCT/US2011/026785 dated Mar. 3, 2011.

International Preliminary Report on Patentability Corresponding to International Application No. PCT/US2011/026785; dated May 3, 2011; 8Pages.

Zorenko et al. "Single-crystalline films of Ce-doped YAG and LuAG phosphors: advantages over bulk crystals analogues" Journal of Luminescence, 114, (2005) 85-94.

Peters et al. "Luminescence and Structural Properties of Thiogallate Phosphors" Electrochem. Soc., 119 (1972) 230-231.

U.S. Appl. No. 11/368,976, filed Mar. 6, 2006, Roberts et al.
U.S. Appl. No. 11/408,648, filed Apr. 21, 2006, Roberts.
U.S. Appl. No. 11/408,767, filed Apr. 21, 2006, Villard.
U.S. Appl. No. 12/250,828, filed Oct. 14, 2008, Toquin.

Campbell et al. "Fabrication of photonic crystals for the visible spectrum by holographic lithography", Nature 404:53-56 (2000).

Kim et al. "Strongly Enhanced Phosphor Efficiency in GaInN White Light-Emitting Diodes Using Remote Phosphor Configuration and Diffuse Reflector Cup" Japanese Journal of Applied Physics 44(21):L649-L651 (2005).

Krauss et al. "Photonic crystals in the optical regime—past, present and future", Progress in Quantum Electronics 23:51-96 (1999).

International Search Report and Written Opinion corresponding to International Application No. PCT/US2008/005694 dated Nov. 6, 2008.

* cited by examiner

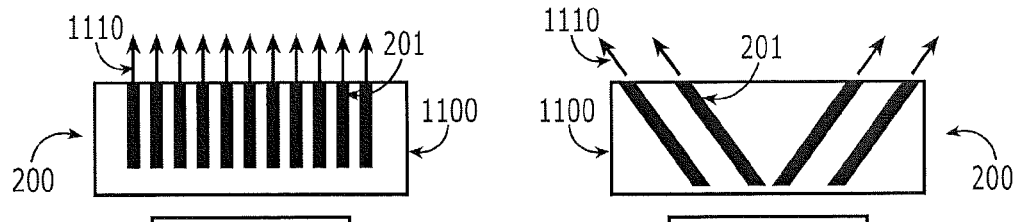
FIG. 11A
FIG. 11B
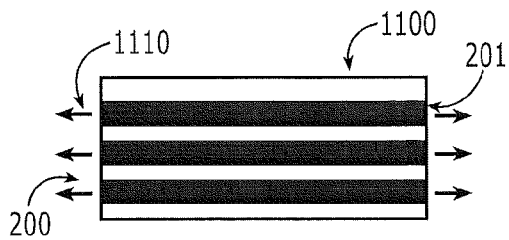
FIG. 11C
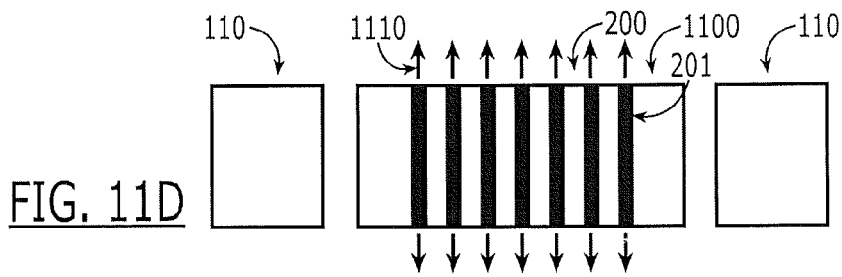
FIG. 11D
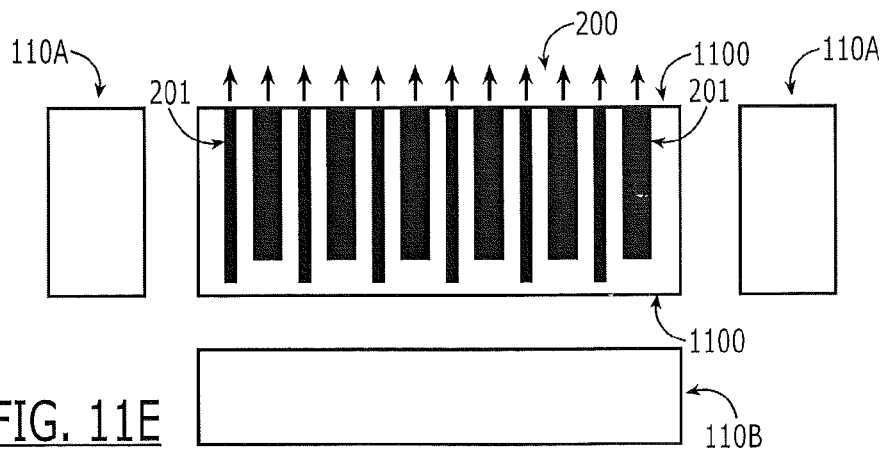
FIG. 11E

PHOTONIC CRYSTAL PHOSPHOR LIGHT CONVERSION STRUCTURES FOR LIGHT EMITTING DEVICES

FIELD OF THE INVENTION

This invention relates to solid state light emitting devices and fabrication methods therefor, and more particularly, to light conversion structures that may be used in solid state light emitting devices.

BACKGROUND OF THE INVENTION

Light emitting diodes and laser diodes are well known solid state lighting elements capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device It is often desirable to incorporate phosphor as part of a solid state light emitting device to enhance the emitted radiation in a particular frequency band and/or to convert at least some of the radiation to another frequency band. The term "phosphor" may be used herein to refer to any materials that absorb light at one wavelength and re-emit light at a different wavelength, regardless of the delay between absorption and re-emission and regardless of the wavelengths involved. Accordingly, the term "phosphor" may be used herein to refer to materials that are sometimes called fluorescent and/or phosphorescent. In general, phosphors absorb light having shorter wavelengths and re-emit light having longer wavelengths. As such, some or all of the light emitted by the LED at a first wavelength may be absorbed by the phosphor particles, which may responsively emit light at a second wavelength(s). For example, a single blue emitting LED may be surrounded with a yellow phosphor, such as cerium-doped yttrium aluminum garnet (YAG). The resulting light, which is a combination of blue light and yellow light, may appear white to an observer.

SUMMARY OF THE INVENTION

Provided according to some embodiments of the present invention are photonic crystal phosphors that include a solid phosphor layer that includes dielectric nanostructures therein. In some embodiments, such dielectric nanostructures are configured such that the solid phosphor layer acts as a photonic crystal. In some embodiments of the invention, the solid phosphor layer is a discrete single phosphor, and in some embodiments, the solid phosphor layer is substantially a discrete single crystal phosphor.

Further provided according to some embodiments of the invention are solid state light emitting devices. Such devices may include a primary solid state light emitting die that is configured to emit light upon energization thereof; and a light conversion structure that includes a photonic crystal phosphor according to an embodiment of the invention on a light emitting surface of the primary solid state light emitting die.

In some embodiments, the solid state light emitting device may also include an adhesive layer that attaches the light conversion structure to the light emitting surface of the primary solid state light emitting die. Furthermore, in some embodiments, the light conversion structure may be sized to fit the light emitting surface of the primary solid state light emitting die. In some embodiments, the light conversion structure is directly on a light emitting surface of the primary solid state light emitting die. In some embodiments, the light conversion structure acts as a substrate for the primary solid state light emitting die. In some embodiments, the solid phosphor layer is spatially separated from the primary solid state light emitting die. In addition, in some embodiments, the solid state light emitting device includes one or more additional solid state light emitting dice configured to emit light upon energization thereof. In some embodiments, a first portion of the dielectric nanostructures are configured to interact with the primary solid state light emitting die and a second portion of the dielectric nanostructures are configured to interact with at least one of the additional solid state light emitting dice.

The photonic crystal phosphor may include a solid phosphor layer having dielectric nanostructures therein, and in some embodiments, the dielectric nanostructures may include holes within the solid phosphor layer. In some embodiments, the solid phosphor layer includes cerium, for example, at a concentration in a range of about 0.1 to about 20 weight percent. In some embodiments, the solid phosphor layer includes $Y_3Al_5O_{12}$ doped with $Ce^{3+}$ (Ce:YAG). In some embodiments, the solid phosphor layer includes $Ca_x$-$Sr_yMg_{1-x-y}AlSiN_3$ doped with cerium or strontium thio-gallate doped with cerium. In some embodiments of the invention, the solid phosphor layer includes europium, for example, at a concentration in a range of about 0.5 to about 20 weight percent. In some embodiments, the solid phosphor layer includes $Sr_{2-x}Ba_xSiO_4$ doped with $Eu^{2+}$ (BOSE) and in some embodiments, the solid phosphor layer includes a europium doped material, such as europium-doped $Ca_xSr_{1-x}$ $AlSiN_3$, strontium thio-gallate, alpha-SiAlON, silicon garnet, $Y_2O_2S$ or $La_2O_2S$. In some embodiments, the solid phosphor layer has a thickness in a range of about 1 μm to about 200 μm. Further, in some embodiments, a surface of the photonic crystal phosphor light conversion structure is texturized, roughened, etched and/or featured.

According to some embodiments of the invention, provided are methods of fabricating solid state light emitting devices that include placing a light conversion structure that includes a photonic crystal phosphor according to an embodiment of the invention on a light emitting surface of a solid state light emitting die. In some embodiments, placing the light conversion structure on the light emitting surface includes adhesively attaching the light conversion structure to the light emitting surface of the solid state light emitting die.

Also provided according to some embodiments of the invention are methods of fabricating solid state light emitting devices that include placing a light conversion structure comprising a solid phosphor layer on a light emitting surface of a solid state light emitting die, and forming dielectric nanostructures in the solid phosphor layer. In some embodiments, placing the light conversion structure on the light emitting surface includes adhesively attaching the solid phosphor layer to the light emitting surface of the solid state light emitting die. In some embodiments, placing the light conversion structure on the light emitting surface includes growing a solid phosphor layer on the surface of the solid state light emitting die via a thin film deposition technique.

Further, according to some embodiments, of the invention, provided are methods of fabricating solid state light emitting devices that include growing a solid state light emitting die on a surface of a light conversion structure that includes a solid phosphor layer having dielectric nanostructures defined therein. In some embodiments, the surface of the light conversion structure may be polished before the solid state light emitting die is grown thereon.

BRIEF DESCRIPTION OF THE DRAWINGS

FIGS. 11A-11E are cross-sectional views of solid state light emitting devices according to embodiments of the present invention.

DETAILED DESCRIPTION OF EMBODIMENTS OF THE INVENTION

Figure 1A:
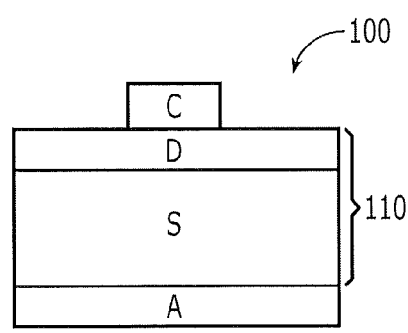
FIGS. 1A-1F are cross-sectional views of various configurations of conventional light emitting diodes.
Figure 1B:
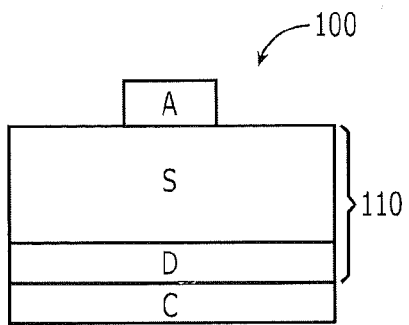

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on," "connected to," "coupled to" or "responsive to" (and/or variants thereof) another element, it can be directly on or directly connected, coupled or responsive to the other element or intervening elements may be present. In contrast, when an element is referred to as being "directly on," "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components. Moreover, the term "consisting essentially of" when used in the specification, specifies the stated number of features, integers, steps, operations, elements and/or components, and precludes additional features, integers, steps, operations, elements and/or components, except for insubstantial amounts of impurities or other materials that do not materially affect the basic and novel characteristics of the stated features, integers, steps, operations, elements and/or components.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

According to some embodiments of the present invention, provided are photonic crystal phosphors. In some embodiments, such photonic crystal phosphors include a solid phosphor layer that includes dielectric nanostructures therein that are configured such that the solid phosphor layer acts as a photonic crystal. In some embodiments of the invention, the solid phosphor layer is a discrete single phosphor, and in some embodiments, the solid phosphor layer is substantially a discrete single crystal phosphor. In some embodiments, the solid phosphor layer is a solid polycrystalline phosphor, such as a solid polycrystalline phosphor having a grain size in a range of about 100 μm to about 1 mm.

According to some embodiments of the present invention, provided are solid state light emitting devices that include a solid state light emitting die that is configured to emit light upon energization thereof and a photonic crystal phosphor light conversion structure on a light emitting surface of the solid state light emitting die. The photonic crystal phosphor light conversion structure may include a solid phosphor layer that includes dielectric nanostructures therein configured such that the solid phosphor layer acts as a photonic crystal. In some embodiments, the solid phosphor layer may be formed on the light emitting surface of the solid state light emitting die by thin film vapor deposition technique, such as MOCVD, MBE, LPE, and the like, as described in further detail below. In such a case, the array of nanostructures in the solid phosphor layer may be formed during or after deposition of the solid phosphor layer on the surface of the solid state light emitting die. In other embodiments, the solid phosphor layer may be grown externally (e.g., via a Czochralksi-type method), which may also be referred to as a preform, optionally sized to fit the light emitting surface of the die, and then attached to the light emitting surface, as described in further detail below. In such cases, the dielectric nanostructures in the solid phosphor layer may be formed either before or after the preform is attached to the solid state light emitting surface of the die. The preform may be adhesively attached to the light emitting die in some embodiments. Furthermore, in some embodiments, the photonic crystal phosphor light conversion structure may act as a substrate for the solid state light emitting die.

A "light conversion structure" is a structure in an LED that includes a solid phosphor layer that may absorb light at one wavelength and re-emit light at another wavelength(s).

A "photonic crystal" is a crystalline material having dielectric nanostructures defined therein. The dielectric nanostructures may be any dielectric nanostructures known to those of skill in the art, including holes of any suitable cross-sectional shape, including regular shapes such as circular, square, hexagonal, and the like, or irregular shapes and cross-section as might, for example, be formed by the intersection of nano-rods arranged at different angles in a so-called woodpile arrangement. Such dielectric nanostructures may be filled with air or another material, such as silicon oxides (SiOx) or aerogels. The dielectric nanostructures may be in any suitable configuration, but in some embodiments, the dielectric nanostructures are present in a periodic array, and in some embodiments, the periodicity is on the same length scale as half the wavelength of the electromagnetic waves propagated therethrough. The configuration, shape, width and depth of the nanostructures will depend on several factors, such as the solid state light emitting die used, the chemical nature of the phosphor layer, the thickness of the solid phosphor layer and the type of photonic effect desired, as will be discussed in further detail below. However, for the dielectric nanostructures, at least one dimension of the nanostructure (e.g., length, width, spacing, etc.) is nanoscale, i.e., less than 1 um.

A "solid phosphor layer" is a phosphor layer having a defined shape and volume sufficient to support the formation of the dielectric nanostructures without substantial change in shape or volume (except for the formed nanostructures). In some embodiments, the solid phosphor layer consists of a discrete single crystal phosphor, meaning that the solid phosphor layer is one continuous single crystal. In some embodiments, the solid phosphor layer is substantially a discrete single crystal phosphor, meaning that the solid phosphor layer is substantially a continuous single crystal, but may have defects and/or minor regions of impurities. In some embodiments, the solid phosphor layer is a solid polycrystalline phosphor, such as a solid polycrystalline phosphor having a grain size in a range of about 100 μm to about 1 mm.

The phrase "adhesively attaching" means bonding two elements to one another. The bonding may be direct via a single adhesive layer or via one or more intermediate adhesive and/or other layers/structures, to form a unitary structure of the solid state light emitting die and the photonic crystal phosphor preform that is adhesively attached thereto, such that this unitary structure may be placed on a submount or other packaging element.

Finally, the term "transparent" means that optical radiation from the solid state light emitting device can pass through the material without being totally absorbed or totally reflected.

The use of a photonic crystal phosphor light conversion structure, according to various embodiments of the invention, may provide many potential advantages. For example, it is often desirable to incorporate phosphor and/or other optical elements into the solid state light emitting device. However, when coating a phosphor layer, the coating may be unduly thick and/or undesirably nonuniform. Moreover, a phosphor layer that is incorporated into a dome or shell also may be too thick and/or nonuniform. In addition, typically, phosphors are generally provided to the LED as a polycrystalline powder, wherein the size and quality of the phosphor particles may significantly affect the quantum efficiency of the phosphor. In addition, the phosphor particles may be applied to the chip in silicone or other polymeric matrix. The correlated color temperature (CCT) of the light emitted from the phosphor particles may be altered by varying the quantity of the phosphor particles in the polymer matrix, or by varying the thickness of the polymer matrix. However, it may be difficult to cut, shape and/or handle some polymeric light conversion structures in order to place them accurately on the chip. Furthermore, although the polymer is only present in the light conversion structure to act as an inert matrix for the phosphor particles, its absorption may become an issue if relatively thick preforms are used. Thus, in practice, relatively thin structures may be used, which may result in handling difficulties, especially in mass production. In addition, the photonic crystal nature of the light conversion structures described herein may allow for directionality of the light emitted from the phosphor, and may allow for the use of relatively thin phosphor layers due to the increased light extraction.

The photonic crystal phosphor light conversion structure may be formed from any suitable phosphor material that may be formed into a solid layer. For example, the phosphor material may be a cerium (Ce) doped phosphor, such as $Y_3Al_5O_{12}$ (Ce:YAG), in some embodiments. In other embodiments, other phosphors, such as Ce and/or europium (Eu) doped $(Ca,Sr,Mg)AlSiN_3$; Eu doped $Sr_{2-x}Ba_xSiO_4$ (BOSE); Ce or Eu doped strontium thio-gallate; or Eu doped alpha-SiAlON, $Y_2O_2S$, $La_2O_2S$, silicon garnet, $Y_2O_2S$ or $La_2O_2S$ may be used. In addition, in some embodiments, the phosphors described in European Patent Publication No. 1,696,016, U.S. Patent Publication No. 2007/0075629 and U.S. patent application Ser. No. 12/250,828, entitled Cerium and Europium-Doped Phosphor Compositions and Light Emitting Devices Including the Same, filed on Oct. 14, 2008 may also be used. The phosphor may also be doped at any suitable level. In some embodiments, Ce and/or Eu is doped into the solid phosphor layer such that the dopant concentration is in a range of about 0.1 to about 20 weight %.

Since the light conversion structures of the invention are formed from photonic crystals, extraction efficiency may be increased relative to traditionally used light conversion structures. Moreover, in some embodiments, the photonic crystal phosphor light conversion structure may be relatively thin, for example, in a range of about 1 μm to about 10 μm, and in other embodiments, in a range of about 5 μm to 500 μm, and in some embodiments, in a range of about 2 μm to about 100 μm.

Internal absorption or bounce seen in polymeric light conversion structures may also be reduced by using a photonic crystal phosphor light conversion structure. Also, in some embodiments, the photonic crystal phosphor light conversion structure is a preform that can be formed separately from the solid state light emitting die, and so it can be fabricated and tested without impacting the reliability and/or yield of the solid state light emitting die. Finally, the solid phosphor layer of the photonic crystal phosphor may allow for more efficient and effective texturization, roughening, etching and/or featuring of the light conversion structure.

FIGS. 1A-1E are cross-sectional views of various configurations of conventional light emitting diodes (LEDs) that may be used with photonic crystal phosphor light conversion structures, optionally in combination with other optical elements, according to various embodiments of the present invention. As shown in FIGS. 1A-1E, a solid state light emitting device 100 includes a solid state light emitting die 110 that may comprise a diode region D and a substrate S. The diode region D is configured to emit light upon energization thereof, by applying a voltage between an anode contact A and a cathode contact C. The diode region D may comprise organic and/or inorganic materials. In inorganic devices, the substrate S may comprise silicon carbide, sapphire and/or any other single element and/or compound semiconductor material, and the diode region D may comprise silicon carbide, gallium nitride, gallium arsenide, zinc oxide and/or any other single element or compound semiconductor material, which may be the same as or different from the substrate S. The substrate S may be between about 100 μm and about 250 μm thick, although thinner and thicker substrates may be used or the substrate may not be used at all. The cathode C and anode A contacts may be formed of metal and/or other conductors, and may be at least partially transparent and/or reflective. The design and fabrication of organic and inorganic LEDs are well known to those having skill in the art and need not be described in detail herein. LEDs such as depicted in FIGS. 1A-1E may be marketed by Cree, Inc., the assignee of the present application, for example under the designators XThin®, MegaBright®, EZBright™, UltraThin™, RazerThin®, XBright®, XLamp® and/or other designators, and by others.

Figure 1C:
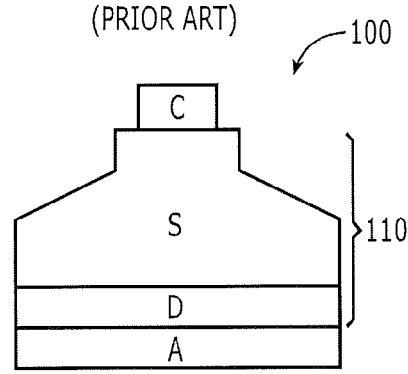
Figure 1D:
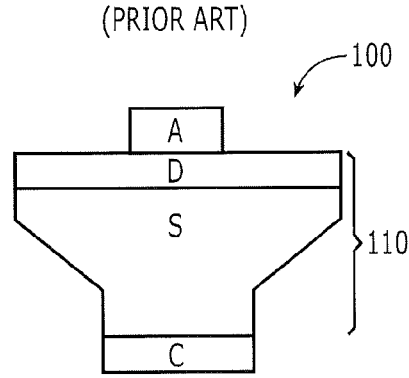
Figure 1E:
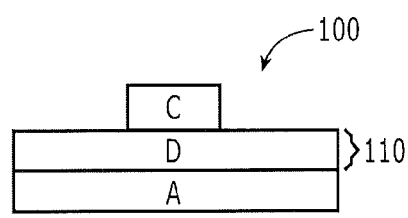

In FIG. 1A, light emission may take place directly from the diode region D. In contrast, in embodiments of FIG. 1B, emission may take place from diode region D through the substrate S. In FIGS. 1C and 1D, the substrate S may be shaped to enhance emission from sidewalls of the substrate S and/or to provide other desirable effects. Finally, in FIG. 1E, the substrate itself may be thinned considerably or eliminated entirely, so that only a diode region D is present. Moreover, in all of the above embodiments, the anode A and cathode C contacts may be of various configurations and may be provided on opposite sides of the solid state light emitting die 110, as illustrated, or on the same side of the solid state light emitting die 110. Multiple contacts of a given type also may be provided.

Figure 1F:
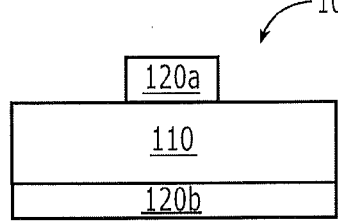

FIG. 1F provides a generalization of FIGS. 1A-1E, by providing a solid state light emitting device 100 that comprises a solid state light emitting die 110 that includes a diode region D of FIGS. 1A-1E and also may include substrates of FIGS. 1A-1E, and that is configured to emit light upon energization thereof via one or more contacts 120a, 120b, which may include the anode A and cathode C of FIGS. 1A-1E.

Figure 1G:
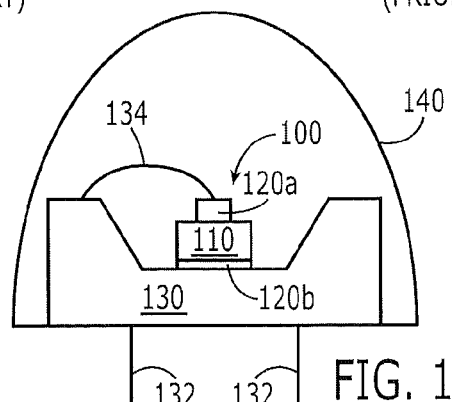
FIG. 1G is a cross-sectional view of a conventional packaged light emitting diode.

FIG. 1G illustrates a solid state light emitting device 100 of FIG. 1F that is packaged by mounting the device 100 on the submount 130 that provides external electrical connections 132 using one or more wire bonds 134 and also provides a protective dome or cover 140. Many other packaging techniques may be employed to package a solid state light emitting die, as is well known to those having skill in the art, and need not be described further herein. For example, packaging techniques are described in U.S. Pat. No. 6,791,119, issued Sep. 14, 2004 to Slater, Jr. et al., entitled Light Emitting Diodes Including Modifications for Light Extraction; U.S. Pat. No. 6,888,167, issued May 3, 2005 to Slater, Jr. et al., entitled Flip-Chip Bonding of Light Emitting Devices and Light Emitting Devices Suitable for Flip-Chip Bonding; U.S. Pat. No. 6,740,906, issued May 24, 2004 to Slater, Jr. et al., entitled Light Emitting Diodes Including Modifications for Submount Bonding; U.S. Pat. No. 6,853,010, issued Feb. 8, 2005 to Slater, Jr. et al., entitled Phosphor-Coated Light Emitting Diodes Including Tapered Sidewalls, and Fabrication Methods Therefor; U.S. Pat. No. 6,885,033, issued Apr. 26, 2005 to Andrews, entitled Light Emitting Devices for Light Conversion and Methods and Semiconductor Chips for Fabricating the Same; and U.S. Pat. No. 7,029,935, issued Apr. 18, 2006 to Negley et al., entitled Transmissive Optical Elements Including Transparent Plastic Shell Having a Phosphor Dispersed Therein, and Methods of Fabricating Same; U.S. Patent Application Publications Nos. 2005/0051789, published Mar. 10, 2005 to Negley et al., Solid Metal Block Mounting Substrates for Semiconductor Light Emitting Devices, and Oxidizing Methods for Fabricating Same; 2005/0212405, published Sep. 29, 2005 to Negley, Semiconductor Light Emitting Devices Including Flexible Film Having Therein an Optical Element, and Methods of Assembling Same; 2006/0018122, published Jan. 26, 2006 to Negley, Reflective Optical Elements for Semiconductor Light Emitting Devices; 2006/0061259, published Mar. 23, 2006 to Negley, Semiconductor Light Emitting Devices Including Patternable Films Comprising Transparent Silicone and Phosphor, and Methods of Manufacturing Same; 2006/0097385, published May 11, 2006 to Negley, Solid Metal Block Semiconductor Light Emitting Device Mounting Substrates and Packages Including Cavities and Heat Sinks, and Methods of Packaging Same; 2006/0124953, published Jun. 15, 2006 to Negley et al., Semiconductor Light Emitting Device Mounting Substrates and Packages Including Cavities and Cover Plates, and Methods of Packaging Same; and 2006/0139945, published Jun. 29, 2006 to Negley et al., Light Emitting Diode Arrays for Direct Backlighting of Liquid Crystal Displays; and U.S. application Ser. No. 11/408,767, filed Apr. 21, 2006 for Villard, Multiple Thermal Path Packaging For Solid State Light Emitting Apparatus And Associated Assembling Methods, all assigned to the assignee of the present invention, the disclosures of which are hereby incorporated herein by reference in their entirety as if set forth fully herein.

FIGS. 2A-2F are cross-sectional views, according to various embodiments of the present invention, of the intermediate fabrication of a solid state light emitting device including a photonic crystal phosphor light conversion structure that is formed, for example, by growing, externally and then attached to the solid state light emitting device (also referred to herein as a "preform"). The respective solid state light emitting devices of FIGS. 2A-2F employ the respective solid state light emitting dice of FIGS. 1A-1F. As described below, the photonic crystal phosphor light conversion structure may be optionally modified, e.g., by cutting, polishing, texturing, and the like, before or after being attached to the solid state light emitting die.

Figure 2A:
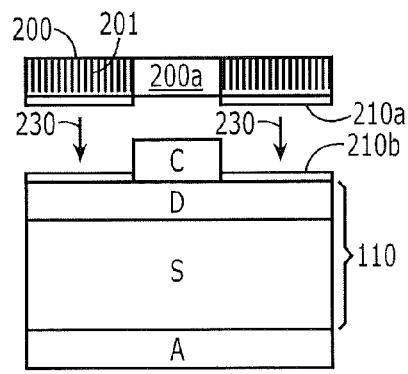
FIGS. 2A-2F are cross-sectional views of solid state light emitting devices according to various embodiments of the present invention during intermediate fabrication thereof.

As shown in FIG. 2A, a photonic crystal phosphor light conversion structure 200 may be sufficiently thin so as to allow at least some light that is emitted from the solid state light emitting die 110 to pass therethrough. A layer 210a, 210b, such as an adhesive layer, also may be provided on the photonic crystal phosphor light conversion structure 200 and/or on the die 110 that attaches, such as adhesively attaches, the photonic crystal phosphor light conversion structure 200 and the solid state light emitting die 110 to one another as shown by arrows 230 and also optically couples the photonic crystal phosphor light conversion structure 200, and the solid state light emitting die 110 to one another. The photonic crystal phosphor light conversion structure 200 is an optical element that can modify at least some of the light that is emitted from the solid state light emitting die 110. The photonic crystal phosphor light conversion structure 200 includes dielectric nanostructures 201 defined therein. Such dielectric nanostructures may be in any suitable configuration in the photonic crystal phosphor light conversion structure 200, as will be discussed in further detail below. Additionally, as described below, other optical elements may be used in combination with the photonic crystal phosphor light conversion structure 200 according to some embodiments of the invention. It will also be understood that, in some embodiments, the layer 210a, 210b may be provided only on the photonic crystal phosphor light conversion structure 200 or only on the die 110. The layer 210a, 210b may be transparent epoxy, such as a thermoset silicone gel or rubber, that is available from Dow Corning, Shin-Etsu, NuSil, GE and others, and/or any other transparent epoxy.

As also shown in FIG. 2A, the photonic crystal phosphor light conversion structure 200 may be relatively rigid compared to silicone-based photonic crystal phosphor light conversion structures. In some embodiments, the photonic crystal phosphor light conversion structure may be the approximate size of a face of an LED die, for example about 1000 μm×1000 μm, and may have a thickness of between about 1 μm and about 100 μm. However, other dimensions may be provided in other embodiments.

As also shown in FIG. 2A, the solid state light emitting die may include an external contact pad, such as cathode C, and the photonic crystal phosphor light conversion structure 200 may include a notch, hole and/or other void 200a that is configured so as to expose the external contact pad C. In embodiments of FIG. 2A, the photonic crystal phosphor light conversion structure 200 is planar and may be of uniform thickness. Moreover, the photonic crystal phosphor light conversion structure 200 of FIG. 2A may be of a same size and shape as a surface of the solid state light emitting die 110, except for a void, notch or other surface feature 200a that may be provided to expose an external contact C. It may also be desirable to provide one or more features in the photonic crystal phosphor light conversion structure to facilitate alignment of the photonic crystal phosphor light conversion structure 200 to the die 110.

Figure 2B:
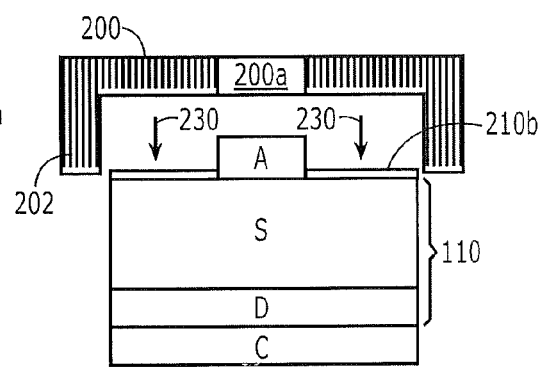

FIG. 2B illustrates other embodiments of the present invention, wherein the photonic crystal phosphor light conversion structure 200 is nonplanar and may include, for example, a sidewall 202 that is configured to extend along a sidewall of the solid state light emitting die 110. Radiation that is emitted from the sidewall of the solid state light emitting die may thereby pass through the photonic crystal phosphor light conversion structure 200, as well as radiation that is emitted from the major surface to which the photonic crystal phosphor light conversion structure 200 is attached. The sidewall 202 may extend partway or fully along the sidewall of the die. Moreover, in some embodiments, the photonic crystal phosphor light conversion structure 200 may extend all the way around the die, including on the sidewalls and the opposing faces of the die. The layer 210b may be located on the die as shown in FIG. 2B, and may also be provided on the photonic crystal phosphor light conversion structure 200 including on the sidewall 202 of the photonic crystal phosphor light conversion structure 200 and/or on the sidewall of the die 110.

Figure 2C:
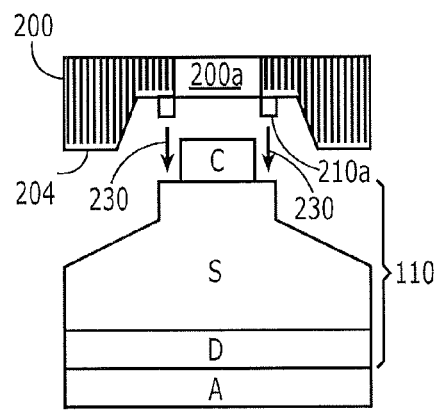

FIG. 2C illustrates other embodiments of the present invention, wherein the photonic crystal phosphor light conversion structure extends beyond a surface of the die 110. Accordingly, as shown in FIG. 2C, the photonic crystal phosphor light conversion structure 200 overhangs a surface of the solid state light emitting die 110. By providing an overhang, radiation from a sidewall of the device may pass through the photonic crystal phosphor light conversion structure 200. The overhang 204 may be thicker than the remaining portion of the photonic crystal phosphor light conversion structure 200. Moreover, the overhang 204 may extend a large distance beyond the die and may extend to a sidewall of a cavity in which the die 110 is mounted, so that substantially all light that is emitted from the cavity passes through the photonic crystal phosphor light conversion structure 200.

Figure 2D:
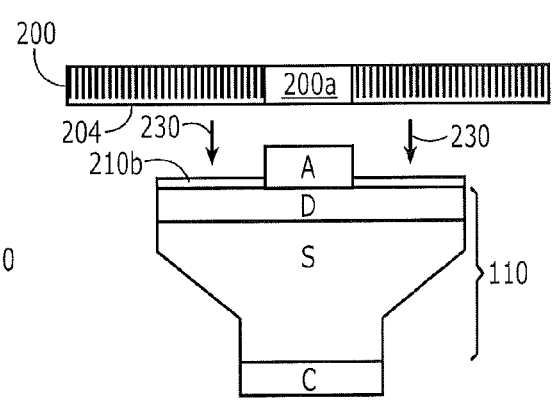
Figure 2E:
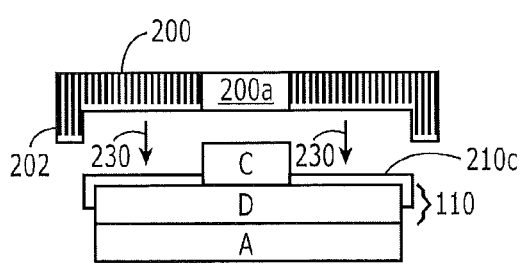
Figure 2F:
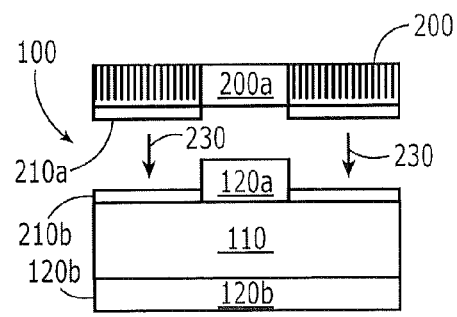

FIG. 2D illustrates other embodiments, wherein a uniform thickness photonic crystal phosphor light conversion structure 200 may include an overhang 204. Again, the overhang 204 may extend a large distance beyond the die and may extend to a sidewall of a cavity in which the die 110 is mounted, so that substantially all light that is emitted from the cavity passes through the photonic crystal phosphor light conversion structure. FIG. 2E illustrates the use of a photonic crystal phosphor light conversion structure of FIG. 2B along with coupling/adhesive layer 210c that extends along the sidewall of the LED die 110, as well as on the top surface thereof. Finally, FIG. 2F generically illustrates the use of a photonic crystal phosphor light conversion structure 200 and a coupling/adhesive layer 210a/210b that attaches the photonic crystal phosphor light conversion structure 200 and a light emitting die to one another, as shown by arrows 230 and couples the photonic crystal phosphor light conversion structure 200 and the light emitting die 110 to one another. It will be understood by those having skill in the art that embodiments of FIGS. 2A-2F may be combined in various permutations and combinations. Thus, for example, a photonic crystal phosphor light conversion structure of FIG. 2D may be used with the solid state light emitting die of FIG. 2C and a photonic crystal phosphor light conversion structure of FIG. 2E may be used with a solid state light emitting die of FIG. 2D.

Figure 3A:
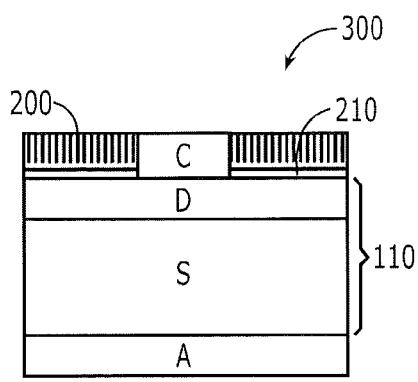
FIGS. 3A-3F are cross-sectional views of solid state light emitting devices after attachment of the photonic crystal phosphor light conversion structure, according to various embodiments of the present invention.
Figure 3B:
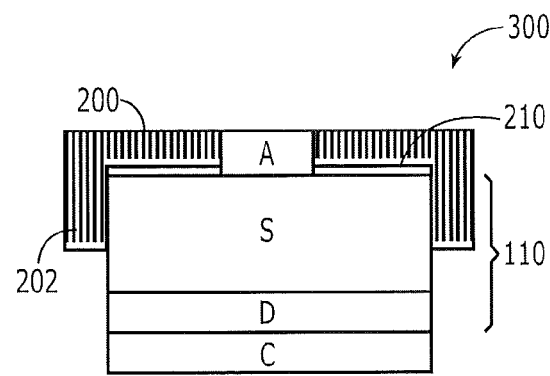

FIGS. 3A-3F correspond to FIGS. 2A-2F, but illustrate the photonic crystal phosphor light conversion structure 200 attached to the light emitting die 110 by a layer 210 that may comprise a coupling/adhesive layer 210a and/or 210b of FIG. 2A. Accordingly, after attachment of the photonic crystal phosphor light conversion structure 200 and die 110, a unitary structure 300 of the solid state light emitting die 110 and the photonic crystal phosphor light conversion structure 200 is provided. This unitary structure 300 may then be mounted on a submount 130 and further packaged, as shown in FIG. 3G.

FIGS. 3H-3N correspond to FIGS. 3A-3G, but illustrate the use of a low profile wire bond 334 that does not pass through the photonic crystal phosphor light conversion structure 200 itself but, rather, passes through the layer 210. In these embodiments, the wire 334 may be bonded to the anode A or cathode C, before placing the adhesive/coupling layer 210 and the photonic crystal phosphor light conversion structure 200 on the die 110. Low profile wire bonding embodiments of FIGS. 3H-3N may obviate the need for a cutout in the photonic crystal phosphor light conversion structure 200, which can facilitate fabrication of the LEDs and can make alignment of the photonic crystal phosphor light conversion structure easier during assembly. Moreover, in these embodiments, it may be desirable to provide a thicker layer 210 to accommodate the wire 334 therein. Thicknesses of between about 35 μm and about 70 μm may be used in some embodiments of the present invention.

The layer 210 may be a liquid epoxy, as described above. The liquid epoxy may be dispensed onto the photonic crystal phosphor light conversion structure 200 and/or solid state light emitting die 110 prior to attachment of the photonic crystal phosphor light conversion structure 200 to the die 110, and then cured after attachment of the photonic crystal phosphor light conversion structure 200 to the die 110. For example, the above-described silicone-based liquid epoxy may be dispensed at room temperature and spread using the pick and place force of the photonic crystal phosphor light conversion structure 200 placement. Curing may then take place by heating in an oven. Adhesive layers of thickness of about 0.1 μm to about 50 μm may be used in some embodiments. Moreover, in other embodiments, a "wicking" adhesive/optical coupling fluid may be applied after placing the photonic crystal phosphor light conversion structure 200 on the die 110, to provide a thin layer 210.

Light conversion structures may be configured, as was illustrated in FIGS. 2A-2F and 3A-3N, to provide various potential advantages according to some embodiments of the invention. For example, in FIGS. 2B, 2E, 3B, 3E, 3I and 3L, the photonic crystal phosphor light conversion structure 200 includes a sidewall 202 that extends at least partially along or adjacent a sidewall of the solid state light emitting die 110. It has been found, according to some embodiments of the present invention, that although light may be primarily emitted from the top surface of the die 110, some low angle sidewall emission may take place. This sidewall emission may adversely impact the desired Correlated Color Temperature (CCT) uniformity of the solid state light emitting device. However, by providing a three-dimensional (non-planar) photonic crystal phosphor light conversion structure 200, side emissions may also be "captured" by the photonic crystal phosphor light conversion structure 200. Back emissions may also be captured, in some embodiments, by providing the photonic crystal phosphor light conversion structure on the opposing faces and the sidewalls of the die.

Figure 3C:
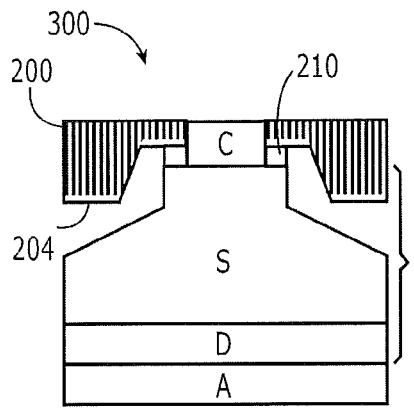
Figure 3D:
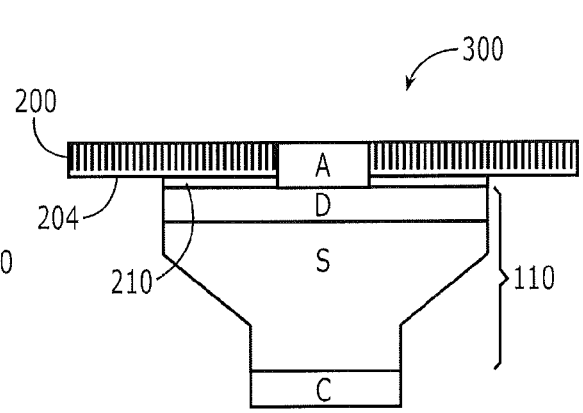
Figure 3E:
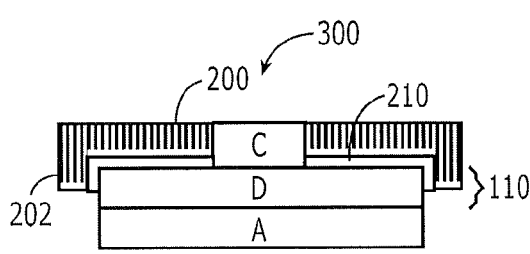
Figure 3F:
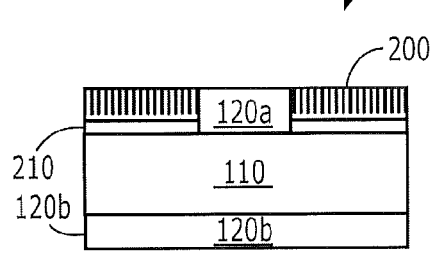
Figure 3G:
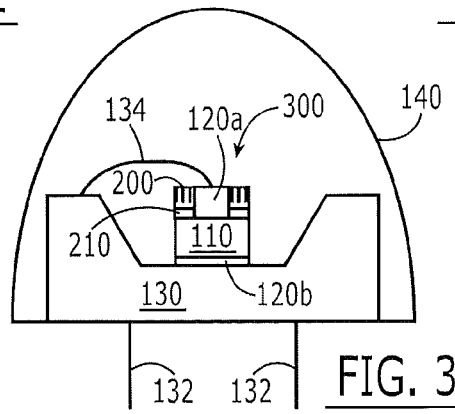
FIG. 3G is a cross-sectional view of a packaged device of FIG. 3F, according to various embodiments of the present invention.
Figure 3H:
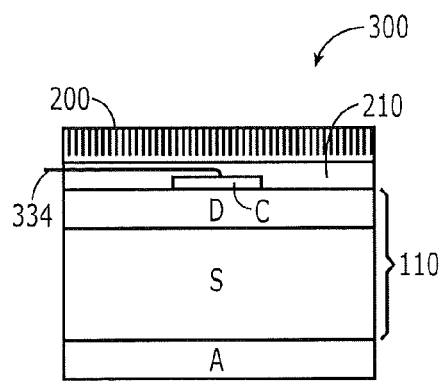
FIGS. 3H-3M are cross-sectional views of solid state light emitting devices after attachment of the photonic crystal phosphor light conversion structure, according to various embodiments of the present invention.
Figure 3I:
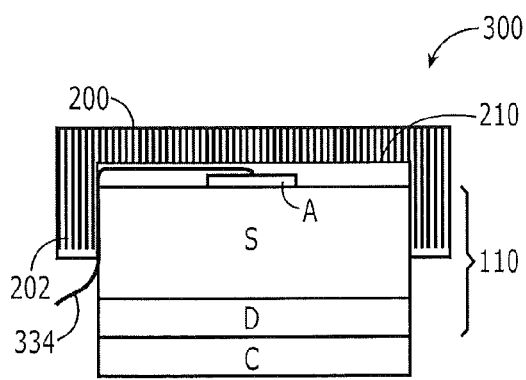
Figure 3J:
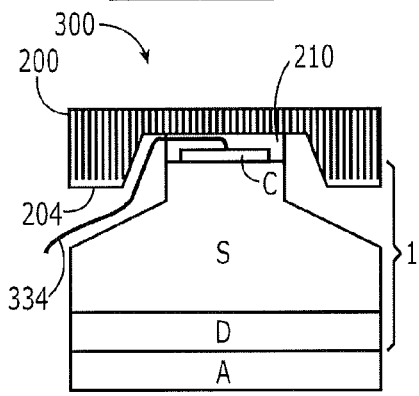
Figure 3K:
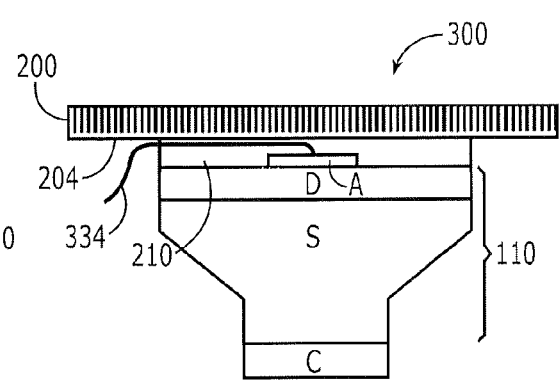
Figure 3L:
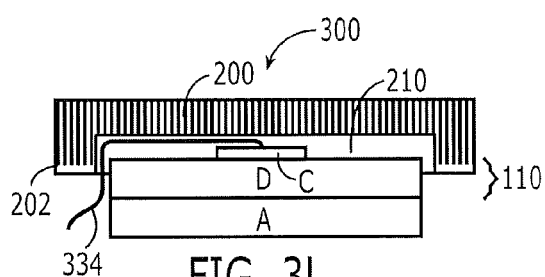
Figure 3M:
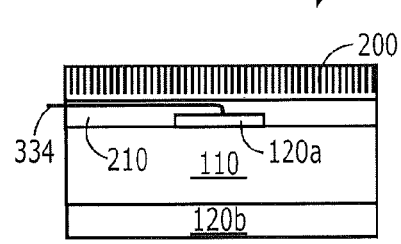

In another example, as illustrated in FIGS. 2C, 2D, 3C, 3D, 3J and 3K, the photonic crystal phosphor light conversion structure may include an overhang 204 that is the same thickness as, or is of different thickness than, the remainder of the photonic crystal phosphor light conversion structure 200. The overhang 204 may capture radiation that is emitted from the sidewall of the solid state light emitting die 110. Moreover, by providing a thicker overhang, the photonic crystal phosphor light conversion structure can convert, for example, a non-Lambertian radiation pattern to a more desirable Lambertian radiation pattern or can convert a somewhat Lambertian radiation pattern to a more Lambertian radiation pattern, in some embodiments. It will be understood by those having skill in the art that the thicker portions of the photonic crystal phosphor light conversion structure of FIGS. 2C, 3C and 3J may extend toward the solid state light emitting die 110 as shown in FIGS. 2C, 3C and 3J and/or away from the solid state light emitting die.

Figure 4:
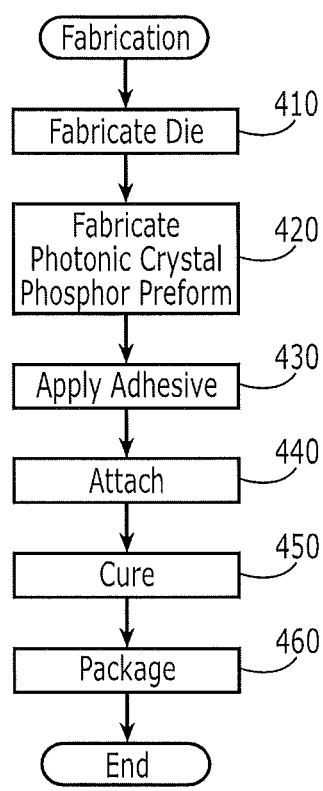
FIG. 4 is a flowchart of operations that may be performed to fabricate solid state light emitting devices according to various embodiments of the present invention.

FIG. 4 is a flowchart of operations that may be performed to fabricate solid state light emitting devices according to various embodiments of the present invention. Referring to FIG. 4, at Block 410, the solid state light emitting die, such as the die 110, is fabricated using conventional techniques. At Block 420, a photonic crystal phosphor light conversion structure, such as the photonic crystal phosphor light conversion structure 200, is fabricated using techniques that will be described in detail below and/or using other photonic crystal phosphor light conversion structure fabrication techniques. It will be understood that the dice and photonic crystal phosphor light conversion structures may be fabricated out of the order shown in FIG. 4 and/or at least partially overlapping in time.

Then, at Block 430, adhesive, such as coupling/adhesive layer 210, is applied to the die 110 and/or the photonic crystal phosphor light conversion structure 200. The photonic crystal phosphor light conversion structure and the die are then attached to one another at Block 440. If needed, the adhesive is cured at Block 450. Subsequent packaging may then take place at Block 460, for example, by bonding the unitary structure of the die 110 and photonic crystal phosphor light conversion structure 200 to a submount and/or other packaging substrate. It will also be understood that a wire bond may be attached to the die before or after performing the attaching step at Block 440.

While the photonic crystal phosphor light conversion structure may be extremely stable at high temperatures, and thus, can be put directly on or next to the light emitting surface, the efficiency of the phosphor is generally inversely related to the temperature of the photonic crystal phosphor light conversion structure 200. The die 110 may be relatively warm, e.g., at about 110° C., and so raising or separating the photonic crystal phosphor light conversion structure 200 from the die 110 may reduce or minimize heating of the photonic crystal phosphor light conversion structure 200, thereby improving quantum efficiency.

Figure 5A:
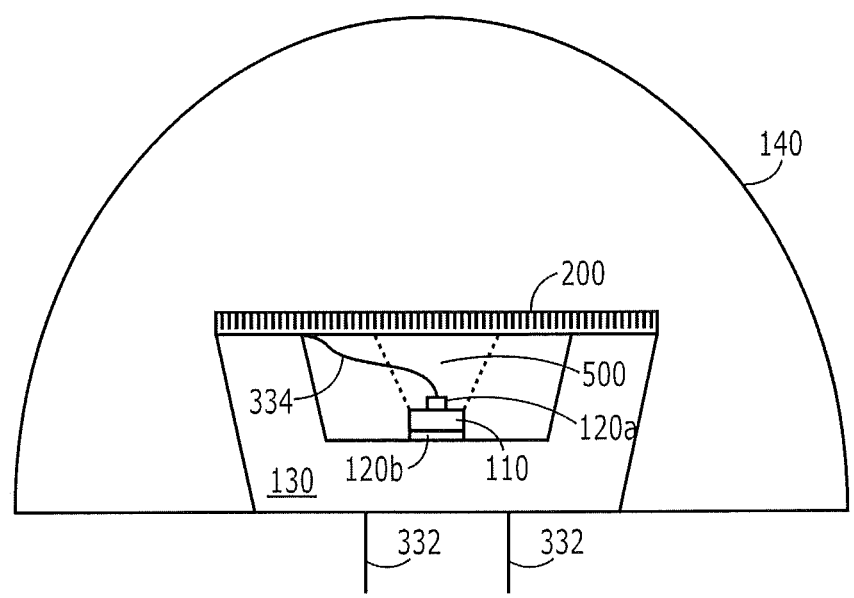
FIGS. 5A and 5B are cross-sectional views of packaged devices according to various embodiments of the present invention.
Figure 5B:
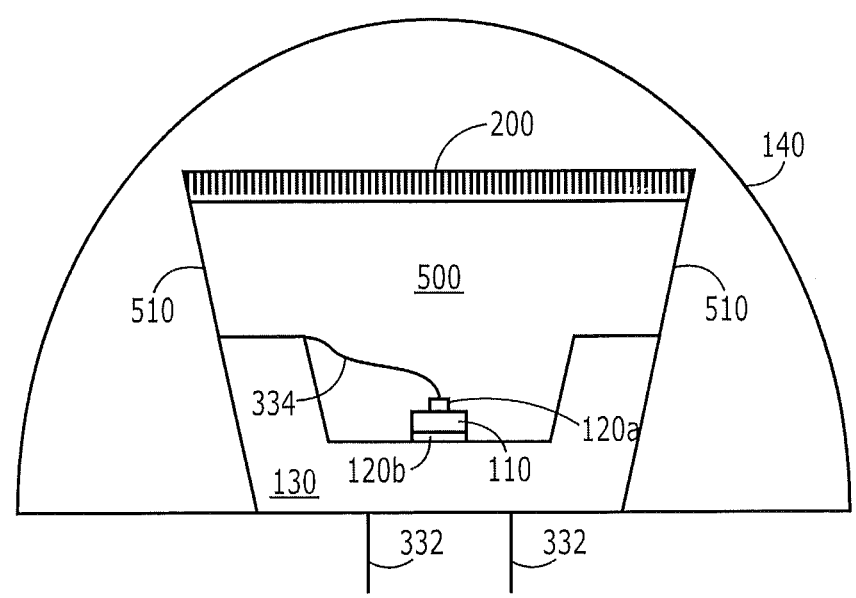
Figure 6A:
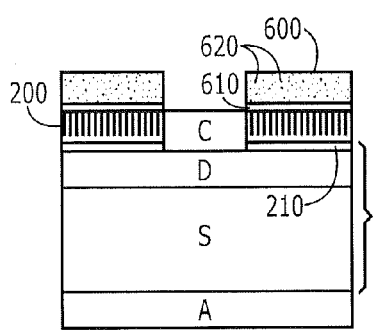
FIGS. 6A-6F are cross-sectional views of solid state light emitting devices according to other embodiments of the present invention.
Figure 6B:
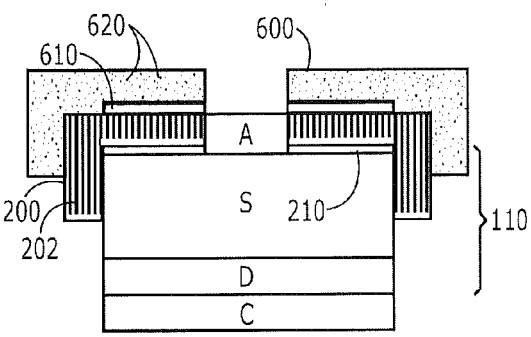
Figure 6C:
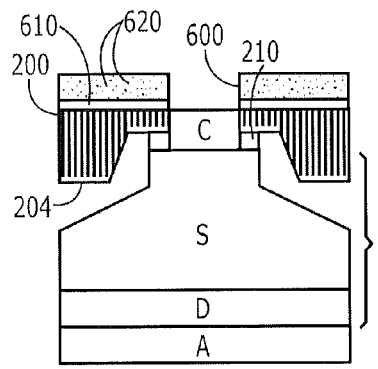
Figure 6D:
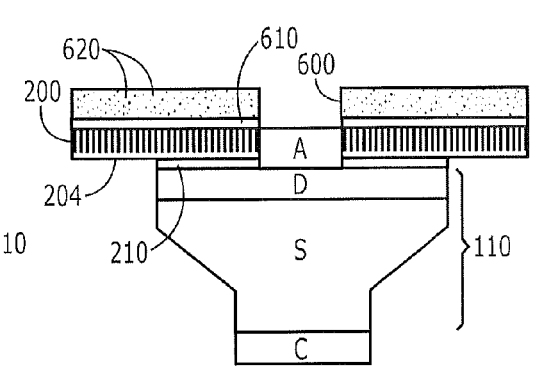
Figure 6E:
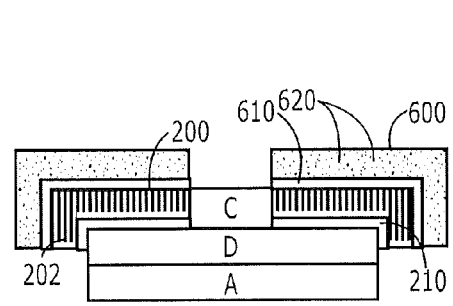
Figure 6F:
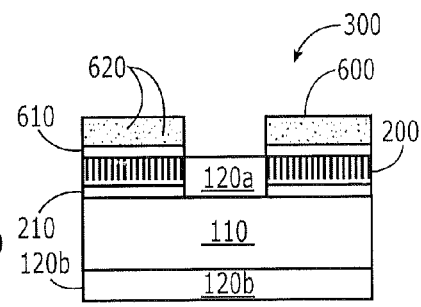
Figure 7A:
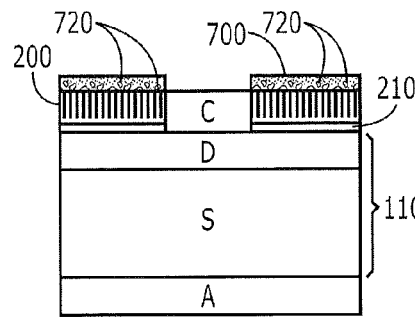
FIGS. 7A-7F are cross-sectional views of solid state light emitting devices according to yet other embodiments of the present invention.
Figure 7B:
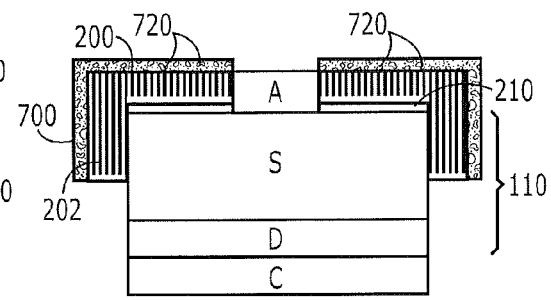
Figure 7C:
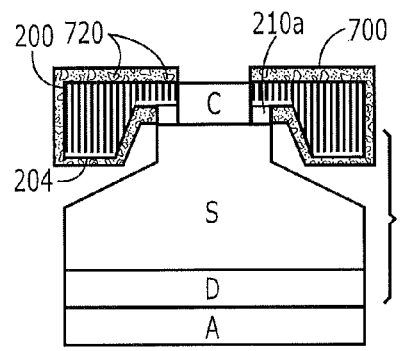
Figure 7D:
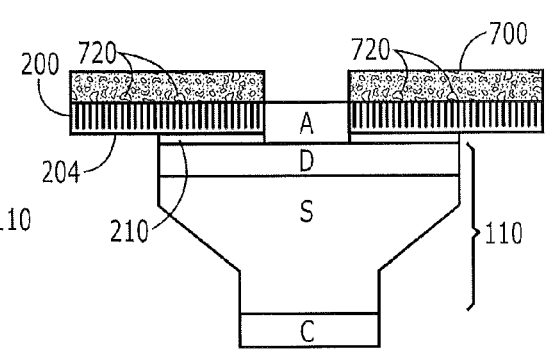
Figure 7E:
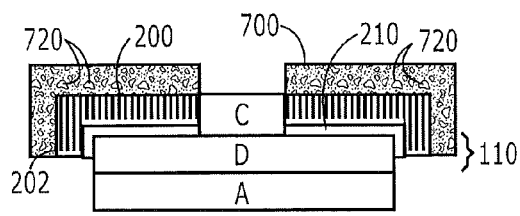
Figure 7F:
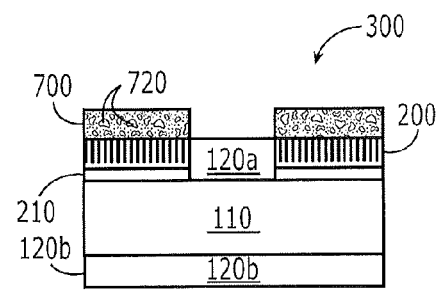
Figure 8A:
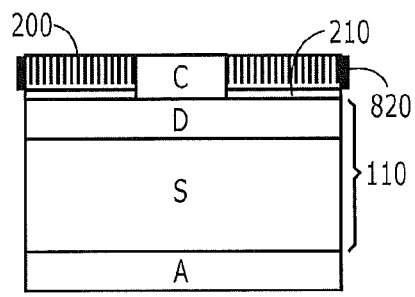
FIGS. 8A-8F are cross-sectional views of solid state light emitting devices according to still other embodiments of the present invention.
Figure 8B:
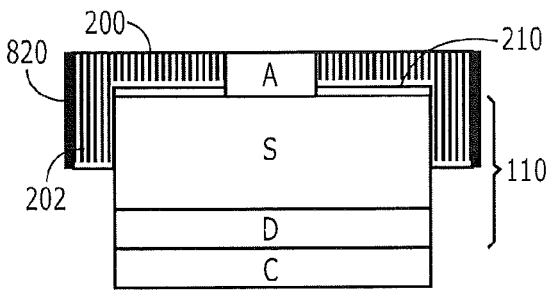
Figure 8C:
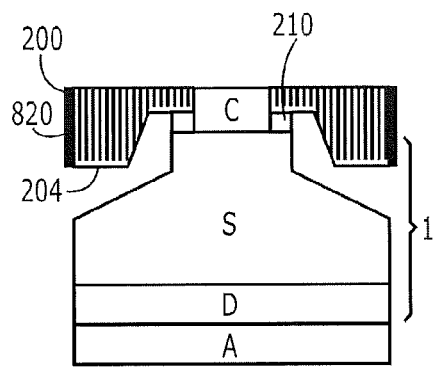
Figure 8D:
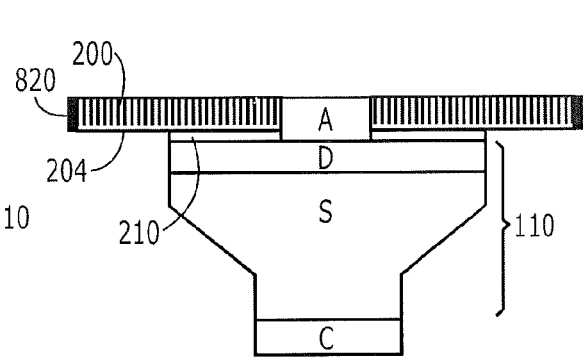
Figure 8E:
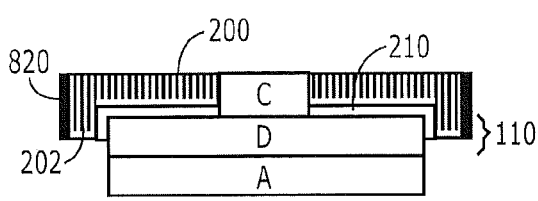
Figure 8F:
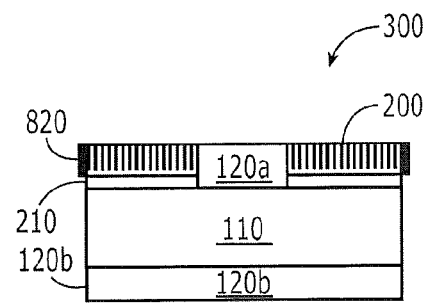
Figure 9A:
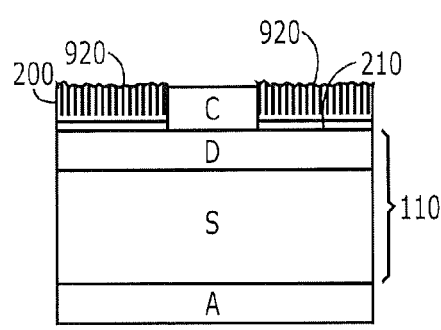
FIGS. 9A-9F are cross-sectional views of solid state light emitting devices according to further embodiments of the present invention.
Figure 9B:
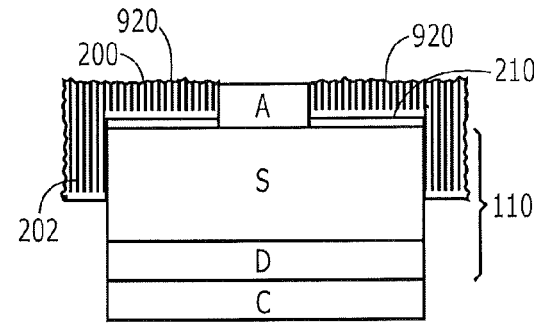
Figure 9C:
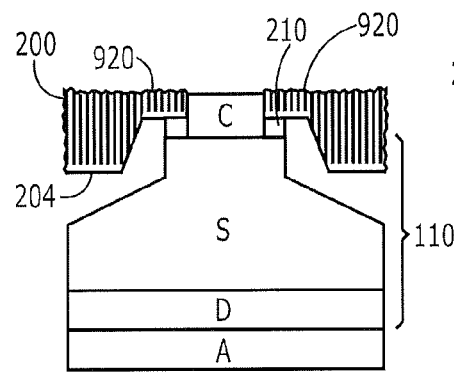
Figure 9D:
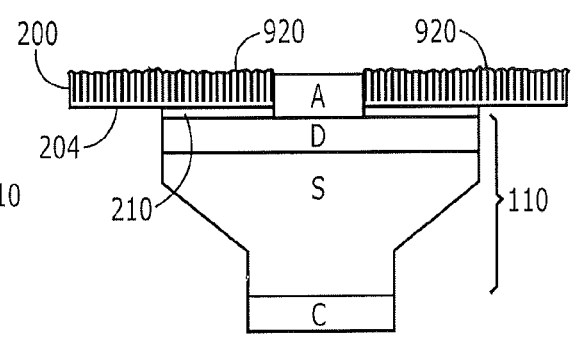
Figure 9E:
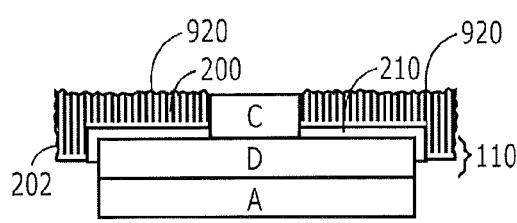
Figure 9F:
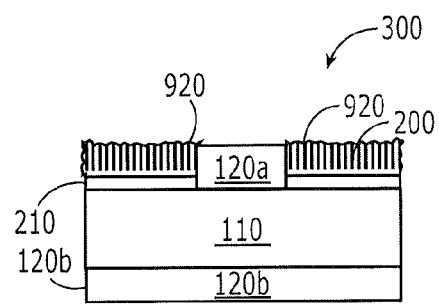

Referring to FIG. 5A, according to some embodiments of the invention, the photonic crystal phosphor light conversion structure 200 is placed over the die 110 and on the submount 130, whereby the photonic crystal phosphor light conversion structure 200 is attached to die 110 via a transparent substrate 500. In other embodiments, the transparent substrate 500 is not present and so the photonic crystal phosphor light conversion structure 200 is not attached to the die 110 via the transparent substrate 500, but instead an empty space is present between the die 110 and the photonic crystal phosphor light conversion structure 200. Referring to FIG. 5B, in some embodiments that may be referred to as "remote phosphor," the photonic crystal phosphor light conversion structure 200 may be raised above the submount 130 via sidewalls 510 and attached to the die 110 via a transparent substrate 500. In some embodiments, the transparent substrate 500 is not present and so the photonic crystal phosphor light conversion structure 200 is not attached to the die 110 via a transparent substrate 500 but is supported by the sidewalls 510. Thus, an empty space is provided between the die 110 and the photonic crystal phosphor light conversion structure 200. The sidewalls 510 may be formed from a reflective surface (e.g., aluminum) and/or coated with a reflective material, in order to more efficiently irradiate the photonic crystal phosphor light conversion structure 200. It will be understood that the distance between the die 110 and the photonic crystal phosphor light conversion structure 200 may be varied according to the configuration of the die 110, submount 130 and transparent substrate 500.

Many other optical elements may be provided in combination with the photonic crystal phosphor light conversion structure, according to various embodiments of the present invention. In general, the optical element may be configured to modify at least some of the light that is emitted from the solid state light emitting die 110, by changing its amplitude, frequency and/or direction. These optical elements may include an additional light conversion structure including polycrystalline phosphor particles, an optical refracting element such as a lens, an optical filtering element such as a color filter, an optical scattering element such as optical scattering particles, an optical diffusing element such as a textured surface and/or an optical reflecting element such as a reflective surface, that is included in and/or on the photonic crystal phosphor light conversion structure. Combinations of these and/or other embodiments may be provided. Moreover, two or more photonic crystal phosphor light conversion structures may be provided, wherein each photonic crystal phosphor light conversion structure can perform a different optical processing function, the same optical processing function or overlapping processing functions, depending upon the desired functionality of the solid state light emitting device. Many other examples will now be described in detail.

For example, as shown in FIGS. 6A-6F, a second light conversion structure 600 that includes scattering particles 620 therein may be attached/coupled by a second layer 610, to separate the functionalities of light conversion and light scattering into two different light conversion structures 200, 600. The second layer 610 may be the same as, or different from, the first layer 210. It will be understood that the order of the first and second light conversion structures 200 and 600 relative to the solid state light emitting die 110 may be reversed from that shown in FIGS. 6A-6F. Moreover, the first and second light conversion structures need not be congruent to one another or of the same thickness. Finally, from a fabrication standpoint, the first and second light conversion structures 200, 600 may be fabricated and then attached to one another before attaching the assembly of the first and second light conversion structures 200/600 to the solid state light emitting die 110. Alternatively, one of the light conversion structures may be attached to the solid state light emitting die 110 and then the other light conversion structure may be attached to the light conversion structure that is already attached to the solid state light emitting die 110. Three or more light conversion structures also may be used in other embodiments of the present invention.

As another example, embodiments that are illustrated in FIGS. 7A-7F provide an optical element, such as polycrystalline phosphor particles 720, on the photonic crystal phosphor light conversion structure 200. The coating may be provided by coating a photonic crystal phosphor light conversion structure at any point during its fabrication and then by attaching a coated photonic crystal phosphor light conversion structure to the solid state light emitting die. However, in other embodiments, coating may be performed after the photonic crystal phosphor light conversion structure is attached to the die.

FIGS. 8A-8F illustrate other embodiments of the present invention, wherein a reflector 820 is provided on the photonic crystal phosphor light conversion structure 200, for example on a sidewall of the photonic crystal phosphor light conversion structure 200. The reflector 820 may change the radiation pattern of the light emitting die by reflecting stray side radiation back into a main radiation path. The reflector 820 may be created by selectively metallizing the photonic crystal phosphor light conversion structure 200 before attachment to the solid state light emitting die. In other embodiments, the photonic crystal phosphor light conversion structure 200 may be metallized after it is attached. It will be understood that mirrors and/or other reflectors 820 may be combined with any of the other embodiments described herein. It will also be understood that the metallization also may be used to provide electrical traces, wiring and/or contacts, so as to provide an electrical element in and/or on the photonic crystal phosphor light conversion structure.

FIGS. 9A-9F illustrate other embodiments of the present invention, wherein the optical element is a diffuser 920 that is formed by texturing a surface of the photonic crystal phosphor light conversion structure 200. The relative rigidity of the solid phosphor layer may facilitate the effective texturization of the surface. Etching, molding, sandblasting and/or other techniques for texturing are well known to those having skill in the art. As is also well known, texturing can provide diffusion of emitted radiation that can allow more uniform CCT. It will also be understood that texturing may be provided on a separate photonic crystal phosphor light conversion structure, and may be combined with any of the other embodiments of the invention that are described herein. Moreover, rather than texturing, a die-scale lens and/or an array of microlenses also may be provided on the surface of the photonic crystal phosphor light conversion structure 200, to provide further optical processing.

It will be understood by those having skill in the art that the surface of a solid state light emitting die itself may be textured by etching the semiconductor material. Unfortunately, this etching may decrease the yield and/or reliability of the solid state light emitting die. In sharp contrast, embodiments of the present invention can texture a separate photonic crystal phosphor light conversion structure using conventional etching techniques, and then use this textured photonic crystal phosphor light conversion structure to reduce or obviate the need to texture the solid state light emitting die itself. This can be done but may change the photonic crystal's light emission properties. The texturing may increase scattering which may in turn increase the amount of light reflected back into the crystal. Conversely, it may however, depending of the length scale of the texture, improve coupling from the photonic phosphor crystal into the surrounding medium.

Figure 10A:
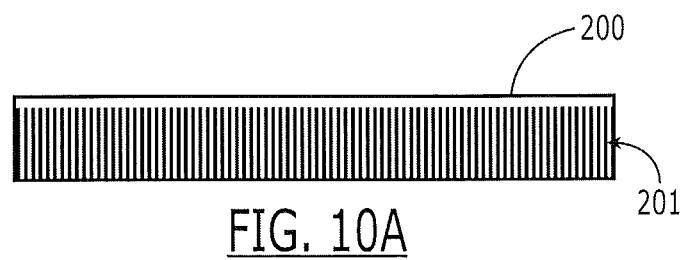
FIGS. 10A and 10B are cross-sectional views of solid state light emitting devices according to various embodiments of the present invention during intermediate fabrication thereof.
Figure 10B:
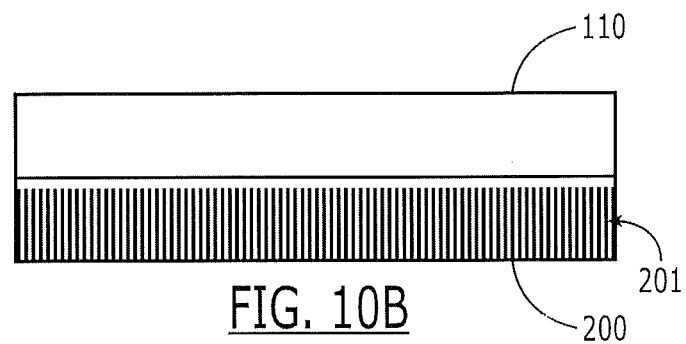

FIGS. 10A and 10B illustrate some embodiments of the invention wherein a photonic crystal phosphor light conversion structure provides a substrate for the epitaxial growth of a solid state light emitting die. FIG. 10A depicts a photonic crystal phosphor light conversion structure 200 according to some embodiments of the invention. As with other embodiments of the invention, any suitable phosphor material may be used, including the specific phosphor materials described herein. FIG. 10B depicts the photonic crystal phosphor light conversion structure 200 acting as a substrate for the solid state light emitting die 110. Generally, the solid state light emitting die 110 is grown on a surface of the photonic crystal phosphor light conversion structure 200 that does not have dielectric nanostructures 201 therein (e.g., on a face opposite dielectric nanostructures 201 that do not traverse entirely through the structure). Any suitable solid state light emitting material may be used, but in some embodiments, Group III nitrides, such as GaN or InGaN, and in some embodiments, materials such as ZnO or GaP, may be used. As with other embodiments described herein, many different configurations may be used, and the configurations may be used in combination with other optical elements, such as the optical elements described herein. These embodiments can use the photonic crystal light conversion structure 200 as a substrate for the epitaxial growth of the solid state light emitting die 110. In some embodiments, one or more buffer layers may be provided therebetween. Moreover, in some embodiments, the phosphor layer itself may be formed on another layer or substrate.

As was described above, in some embodiments, the photonic crystal phosphor light conversion structures may be planar and may be the same size and shape as a surface of the light emitting die. In other embodiments, the photonic crystal phosphor light conversion structures may be laser or saw cut into a desired shape, to provide, for example, wire bond notches in a square photonic crystal phosphor light conversion structure and/or to allow the photonic crystal phosphor light conversion structure to fit on and around the die surface. In other embodiments, desired shapes may be formed by etching a photonic crystal phosphor light conversion structure after it is formed. Moreover, in some embodiments, three-dimensional preforms may be fabricated that can provide photonic crystal phosphor light conversion structures having a shallow cup shape to allow edge of the die coverage by the photonic crystal phosphor light conversion structure, with appropriate cutouts for wire bonds and/or other features.

Many different configurations of dielectric nanostructures may be provided. Referring to FIGS. 11A-11E, the dielectric nanostructures 201 of the photonic crystal phosphor light conversion structure 200 may be present as an array of holes in the solid phosphor layer 1100. Such holes may be filled with air or another material, such as silicon oxides (SiOx) or aerogels. The holes may be present in any suitable configuration, but in some embodiments, the holes are present in a periodic array such that the periodicity is on the same length scale as half the wavelength of the electromagnetic waves propagated therethrough. Furthermore, in some embodiments, the holes are spaced between 200 to 500 nm apart. In some embodiments, the holes may traverse through the solid phosphor layer, but in some embodiments, the holes may traverse only 40%, 50%, 60%, 70%, 80%, 90% or 95% of the thickness of solid phosphor layer, such that dielectric nanostructures 201 are only present on one face of the solid phosphor layer, while other faces may not have dielectric nanostructures 201 therein. In some embodiments, the width of the holes is in a range of about 50 nm to about 250 nm. The configuration, shape, width and depth of the holes will depend on several factors, such as the solid state light emitting die used, the chemical nature of the phosphor layer 1100, the thickness of the solid phosphor layer 1100 and the photonic effect desired. However, at least one dimension of the holes will be in the nanoscale range. In addition, the solid state light emitting die 110 may in any suitable direction with respect to the photonic crystal phosphor light conversion structure 200 and with respect to the dielectric nanostructures 201.

As described above, any suitable configuration of the dielectric nanostructures 201 may be used in embodiments of the invention. However, the configuration, shape, width and depth of the dielectric nanostructures 201 that may be formed in the solid phosphor layer 1100 may include those found in "Fabrication of photonic crystals for the visible spectrum by holographic lithography," *Nature*, 404, 53-56 (2 Mar. 2000) by M. Campbell, D. N. Sharp, M. T. Harrison, R. G. Denning and A. J. Turberfield, the relevant portions of which are hereby incorporated by reference.

Examples of configurations will now be discussed. Referring to FIG. 11A, in some embodiments, the photonic crystal phosphor light conversion structure 200 may be on the solid state light emitting die 110. When the dielectric nanostructures 201 include an array of holes, the holes may be any suitable depth and width, which may depend on several factors, as described above. The radiation emitted from the solid state light emitting die 110 may be modified by the photonic crystal phosphor light conversion structure 200. In addition, the dielectric nanostructures 201 may allow for the light 1110 from the photonic crystal phosphor light conversion structure 200 to be emitted in a particular direction.

Referring to FIGS. 11B and 11C, the dielectric nanostructures 201 may be in any suitable formation or direction. In FIG. 11B, the dielectric nanostructures 201 are holes that are tilted from a position perpendicular to a light emitting surface of the solid state light emitting die 110. Thus, the light 1110 emitted from the photonic crystal phosphor light conversion structure 200 may be directed in a particular direction or pattern. In FIG. 11C, the dielectric nanostructures 201 are parallel to the light emitting surface of the solid state light emitting die 110. Thus, the light 1110 from the photonic crystal phosphor light conversion structure 200 may be directed parallel to the surface of the solid state light emitting die 110. In other embodiments, the dielectric nanostructures 201 may be randomly or pseudo-randomly oriented so that direction of light is also random or pseudo-random.

Referring to FIGS. 11D and 11E, more than one solid state light emitting die 110 may be used in conjunction with the photonic crystal phosphor light conversion structure 200. The solid state light emitting dice 110 may emit light at the same wavelength or at different wavelengths, and the dielectric nanostructures 201 may interact with each of the solid state light emitting dice 110 in the same manner, or some of the dielectric nanostructures 201 may be configured to interact with the light emitted from one solid state light emitting die 110, while other dielectric nanostructures 201 may be configured to interact with light emitted from the other solid state light emitting die 110. Referring to FIG. 11E, the size and spacing of the dielectric nanostructures 201 may be varied for interaction with the light emitted from the different solid state light emitting dice 110. For example, two of the solid state light emitting dice 110A located on opposite ends of the photonic crystal phosphor light conversion structure 200 may emit red light and another 110B may emit blue light, and some of the dielectric nanostructures 201 may interact with the solid state light emitting dice 110A, and some of the dielectric nanostructures 201 may interact with the solid state light emitting die 110B. For the structures described in FIGS. 11A-11E, the photonic crystal phosphor light conversion structure 200 is depicted as a planar. However, as one of skill in the art will appreciate, the photonic crystal phosphor light conversion structure 200 may be in any suitable shape, including structures that are non-uniform in thickness and/or overhang the solid state light emitting die 110, for example, those structures described in FIGS. 2A-2F.

Figure 12:
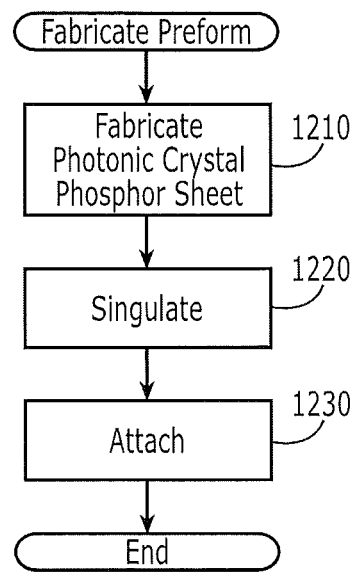
FIG. 12 is a flowchart of operations that may be performed to fabricate a single crystal light conversion structure according to various embodiments of the present invention.

FIG. 12 is a flowchart of operations that may be performed to fabricate a photonic crystal phosphor light conversion structure, according to various embodiments of the present invention, which may correspond to Block 420 of FIG. 4. As shown at Block 1210, a solid phosphor sheet is fabricated, e.g., by a Czochralski-type method. A Czochralski-type method is a method of producing large single crystals, or boules, by inserting a small seed crystal of an inorganic material into a crucible filled with similar molten material, then slowly pulling the seed up from the melt while rotating it. In some embodiments, the solid phosphor sheet may be grown on a carrier substrate, such as a glass substrate. Once a solid phosphor sheet is fabricated, it may be patterned to create the dielectric nanostructures 201. Any suitable method for forming a photonic crystal may be used. Such techniques are known in the art, and may include, lithographic, etching and masking techniques. Suitable techniques for forming the dielectric nanostructures 201 include those described in "Fabrication of photonic crystals for the visible spectrum by holographic lithography," *Nature*, 404, 53-56 (2 Mar. 2000) by M. Campbell, D. N. Sharp, M. T. Harrison, R. G. Denning and A. J. Turberfield, the relevant portions of which are hereby incorporated by reference.

Referring back to FIG. 12, at Block 1220, the solid phosphor sheet is singulated to form individual photonic crystal phosphor light conversion structures. The solid phosphor layer may be patterned to create the dielectric nanostructures 201 before or after singluation. In some embodiments, the solid phosphor sheet is singulated, but an attached substrate is not singulated, while in other embodiments, both the solid phosphor sheet and the attached substrate are singulated. The photonic crystal phosphor light conversion structure may be removed from the substrate using a pick and place and/or conventional mechanism, and attached to the solid state light emitting die, as shown in Block 1230. Some embodiments of the present invention can allow mass production of photonic crystal phosphor light conversion structures which due to their rigidity may be handled by automated equipment.

Figure 13:
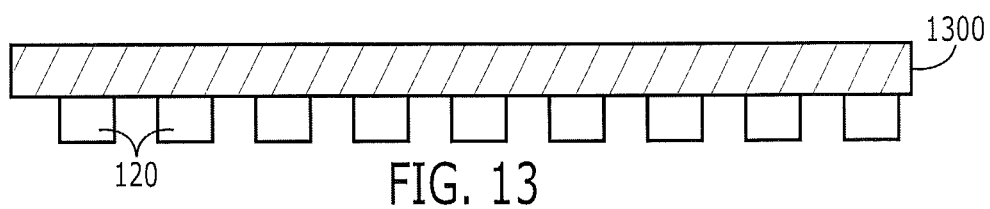
FIG. 13 is a cross-sectional view of a large area preform that is configured to attach to multiple solid state light emitting dice according to various embodiments of the present invention.

Embodiments of the present invention have been described above in connection with a photonic crystal phosphor light conversion structure that is a preform that is adhesively attached to a single LED. However, in other embodiments, as illustrated in FIG. 13, large photonic crystal phosphor preform sheets 1300 could be used to adhesively attach multiple LED dice 120 in large fixtures. The type of photonic crystal phosphor and the thickness of the sheets 1300 may be altered to make different temperatures of white light, depending on which sheets are used. Different types of light, such as morning sunlight, noonday sunlight, evening light and/or other colors, may then be provided, by changing or adding/subtracting phosphor sheets for emission control.

Alternatively, the large photonic crystal phosphor preform sheets 1300 could be used in a remote phosphor light fixture. For example, one or more LEDs, dice or packaged, could be provided in a chamber, such as a cylindrical or frusto-conical chamber, and one or more of the perform sheets 1300 provided at an opposing end of the chamber. Such perform sheet 1300 could be spaced as described, for example, in U.S. Pat. No. 7,614,759, the disclosure of which is incorporated herein by reference as if set forth in its entirety.

Spacing of a phosphor from a light emitter may improve the efficiency of the emitter/phosphor system. While not being limited to a particular theory of operation, it is believed that at least some of this efficiency increase may be the result of reducing absorption by the light emitter of the light generated by the phosphor. As such, improving the light extraction of the phosphor may result in less light to be absorbed by the LED. Thus, the LED and phosphor may be spaced more closely than in systems that do not have photonic crystal phosphors while maintaining efficiency or efficiency may be improved for a given distance between the phosphor and the LED.

As described above, instead of the photonic crystal phosphor light conversion structures 200 grown externally, in some embodiments of the invention, a solid phosphor layer may be grown on a light emitting surface of a solid state light emitting die and then processed to form the dielectric nanostructures. The term "grown," as used herein, refers to the formation of a phosphor thin film via any thin film deposition technique, such as metal organic chemical vapor deposition (MOCVD), molecular beam epitaxy (MBE), low pressure deposition (LPD), and any other thin film deposition technique known to those of skill in the art. The dielectric nanostructures 201 may be formed after the solid phosphor layer is grown or the dielectric nanostructures 201 may be formed during the growth of the solid phosphor layer, for example, by masking, deposition of sacrificial structures and/or using lithographic techniques.

Figure 3N:
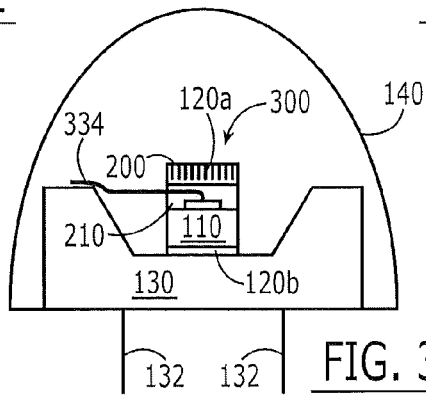
FIG. 3N is a cross-sectional view of a packaged device of FIG. 3M, according to various embodiments of the present invention.

As with the phosphor preforms, LEDs including a solid phosphor layer grown directly on the light emitting die may be in many different configurations. For example, any of the configurations illustrated in FIGS. 3A-3N may be produced by growing a solid phosphor layer on the solid state light emitting die and then processing the solid phosphor layer to form the dielectric nanostructures. In addition, the configurations shown in FIGS. 5A and 5B could also be achieved by using a phosphor thin film deposition technique with subsequent processing. For example, referring to FIG. 5A, a sacrificial layer or other support structure could be provided in the submount 130 in order to allow for the growth of the solid phosphor layer. As another example, referring to FIG. 5B, a solid phosphor layer may be grown on the transparent substrate 500, or as with FIG. 5A, a support layer could be provided for the growth of the solid phosphor layer. Referring to FIGS. 3A-3N, in some embodiments, the solid phosphor layers may be grown directly on the surface of the die 110. Thus, the coupling/adhesive layer 210 may not necessarily be present in the LED, but in some embodiments, the coupling/adhesive layer 210 could be present, particularly to provide a layer through which a low profile wire bond 334 may be passed through. In addition, in some embodiments, selective growth of the solid phosphor layer and/or the dielectric nanostructures, may be achieved via masking or lithographic techniques known to those of skill in the art. Also according to some embodiments, a support layer and/or a sacrificial layer may be formed on or adjacent to the solid state light emitting die 110 in order to support the formation of various shapes and configurations of solid phosphor layers. It will also be understood that masking and etching processes may be used in combination.

Figure 14:
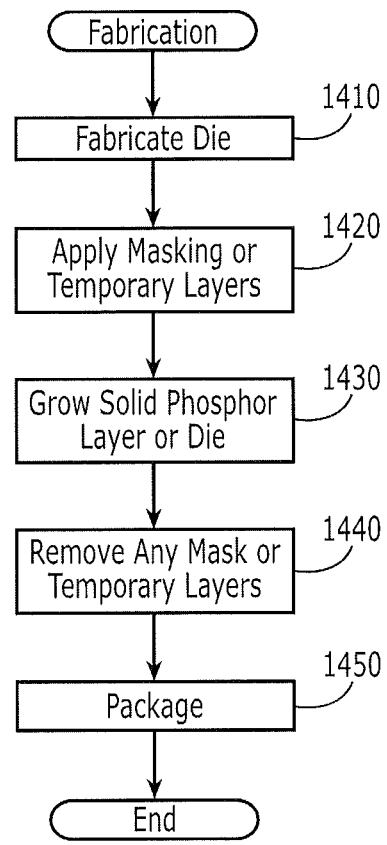
FIG. 14 is a flowchart of operations that may be performed to fabricate solid state light emitting devices according to various embodiments of the present invention.

FIG. 14 is a flowchart of operations that may be performed to fabricate solid state light emitting devices according to embodiments of the present invention. Referring to FIG. 14, at Block 1410, the solid state light emitting die, such as the die 110, is fabricated using conventional techniques. At Block 1420, a mask, a coupling layer, and/or a temporary layer (such as a sacrificial layer or support layer) may, in some embodiments, be formed on and/or adjacent to the solid state light emitting die. For example, in embodiments illustrated in FIGS. 3A-3G, the anode or cathode may be masked so as to allow the formation of the photonic crystal phosphor light conversion structure on the die 110 but not the contact 120a. In addition, configurations such as those depicted in FIGS. 3B, 3C, 3D 3F, 3I, 3J, 3K and 3L may require temporary supports or sacrificial layers on and/or adjacent to the die 110 in order to provide support for the formation of nonplanar and/or overhanging photonic crystal phosphor light conversion structures. Referring to Block 1430, a solid phosphor layer (which may be a photonic crystal if dielectric nanostructures 201 are formed in situ during growth of the phosphor) may be grown on a surface of the die 110. Removal of a mask, a support layer and/or a sacrificial layer may occur in some embodiments at Block 1440. Subsequent packaging may then take place at Block 1450, for example, by bonding the unitary structure of the die 110 and the photonic crystal phosphor light conversion structure 200 to a submount and/or other packaging substrate. It will also be understood that a wire bond may be attached to the die before or after depositing step at Block 1430.

As with the photonic crystal phosphor light conversion structures grown externally, many other optical elements may be provided in combination with photonic crystal phosphor light conversion structures that are grown directly on the surface of the light emitting die. All of the optical elements and combinations described with reference to photonic crystal phosphor light conversion structures grown externally (preforms) may also be used with photonic crystal phosphor light conversion structures grown on the solid state light emitting die, including photonic crystal phosphor light conversion structures comprising scattering particles, as illustrated in FIGS. 6A-6F; polycrystalline phosphor particle coatings, as illustrated in FIGS. 7A-7F; reflectors, as illustrated in FIGS. 8A-8F; and diffusing elements, as illustrated in FIGS. 9A-9F.

Figure 15:
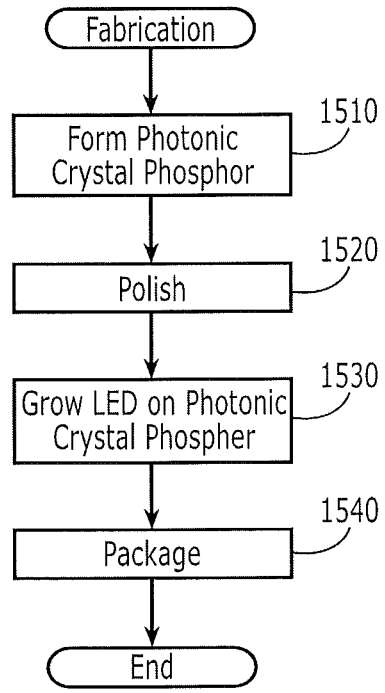
FIG. 15 is a flowchart of operations that may be performed to fabricate solid state light emitting devices according to various embodiments of the present invention.

FIG. 15 is a flowchart of operations that may be performed to fabricate solid state light emitting devices according to other embodiments of the present invention. Referring to FIG. 15, at Block 1510, a solid phosphor layer (which may be a photonic crystal if dielectric nanostructures 201 are formed in situ during growth of the phosphor) may be grown using any suitable technique, such as by any of the techniques described herein. In some embodiments, the solid phosphor layer is grown on another layer or substrate. Moreover, in some embodiments, the solid phosphor layer may be grown on one substrate and transferred to another substrate for further processing. In some embodiments, the dielectric nanostructures 201 may then be formed in the solid phosphor layer. At Block 1520, a surface of the solid phosphor layer may then be polished, e.g., by using a polishing technique known in art for polishing crystalline layers and/or other inorganic layers. At Block 1530, a solid state light emitting die may then be epitaxially grown on the polished surface of the solid phosphor layer. Any suitable technique for growing the solid state light emitting die may be used. For example, techniques for growing Group III nitrides, such as GaN or InGaN, on the solid phosphor layer may be similar to those used in growing Group III nitrides on other substrates such as silicon, silicon carbide and sapphire. Particular techniques may be similar to those described in U.S. Pat. Nos. 7,211,833, 7,170,097, 7,125,737, 7,087,936, 7,084,436, 7,042,020, 7,037,742, 7,034,328 and 7,026,659, the contents of each of which are incorporated herein by reference in their entirety. In some embodiments, one or more buffer layers are provided on the solid phosphor layer before the solid state light emitting die is epitaxially grown thereon. At Block 1540, the resulting solid state light emitting device may be packaged, which may include, e.g., singulation of the solid state light emitting die grown on the solid phosphor layer.

Figure 16:
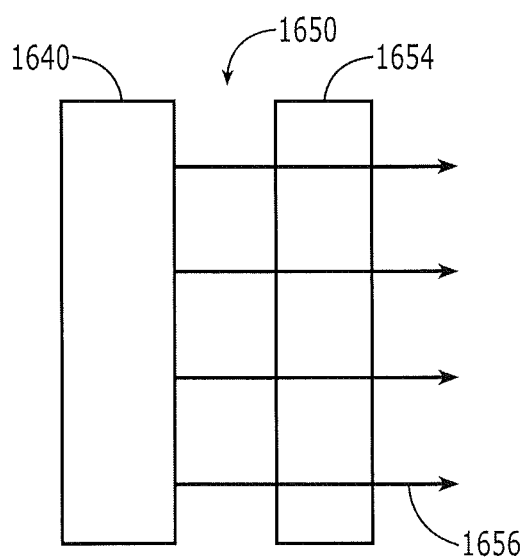
FIG. 16 is a schematic illustration of a display unit having a backlight including a light emitting device according to some embodiments of the invention.

The light emitting devices provided according to some embodiments of the invention may be used in many applications. For example, referring to FIG. 16, a lighting panel 1640 including a plurality of light emitting devices according to some embodiments of the invention may be used as a backlight for a display such as a liquid crystal display (LCD) 1650. Systems and methods for controlling solid state backlight panels are described, for example, in U.S. patent application Ser. No. 11/368,976, filed Mar. 6, 2006 entitled Adaptive Adjustment of Light Output of Solid State Lighting Panels, which is assigned to the assignee of the present invention and the disclosure of which is incorporated herein by reference in its entirety. As shown in FIG. 16, an LCD 1650 may include a lighting panel 1640 that is positioned relative to an LCD screen 1654 such that light 1656 emitted by the lighting panel 1640 passes through the LCD screen 1654 to provide backlight for the LCD screen 1654. The LCD screen 1654 includes appropriately arranged shutters and associated filters that are configured to selectively pass/block a selected color of light 1656 from the lighting panel 1640 to generate a display image. The lighting panel 1640 may include a plurality of light emitting devices according to any of the embodiments described herein.

Figure 17:
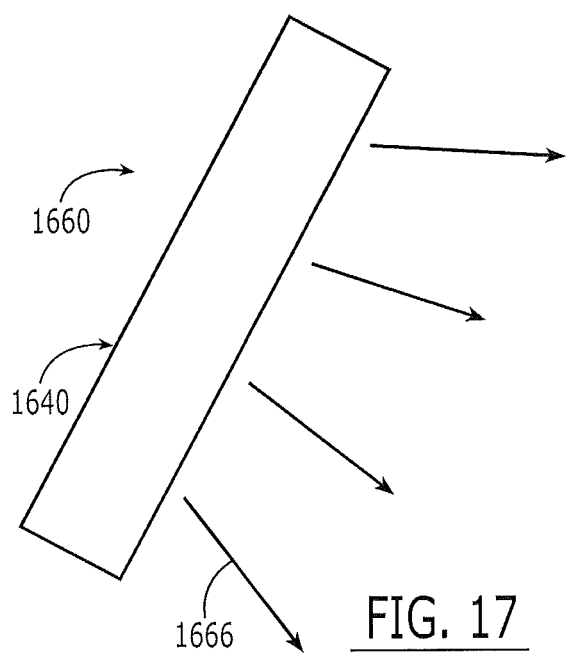
FIG. 17 is a schematic illustration of a solid state luminaire including a light emitting device according to some embodiments of the invention.

As an additional example, referring to FIG. 17, a lighting panel 1640 including a plurality of light emitting devices according to some embodiments of the invention may be used as a lighting panel for a solid state lighting fixture or luminaire 1660. Light 1666 emitted by the luminaire 1660 may be used to illuminate an area and/or an object. Solid state luminaires are described, for example, in U.S. patent application Ser. No. 11/408,648, filed Apr. 21, 2006, entitled Solid State Luminaires for General Illumination, which is assigned to the assignee of the present invention and the disclosure of which is incorporated herein by reference in its entirety.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

We claim:
1. A photonic crystal phosphor comprising a single crystal of phosphor having a first face and a second face opposite the first face, wherein the single crystal of phosphor comprises dielectric nanostructures therein, and wherein the dielectric nanostructures extend from the first face of the single crystal of phosphor toward the second face of the single crystal of phosphor by a distance between 40% and 95% of a thickness of the single crystal of phosphor;
   wherein each dielectric nanostructure of a first portion of the dielectric nanostructures has a width that is less than a width of each dielectric nanostructure of a second portion of the dielectric nanostructures, wherein each dielectric nanostructure of the first portion of the dielectric nanostructures has a depth that is greater than a depth of each dielectric nanostructure of the second portion of the dielectric nanostructures, and wherein the second portion of the dielectric nanostructures are dispersed among the first portion of the dielectric nanostructures.
2. A solid state light emitting device comprising:
   a primary solid state light emitting die that is configured to emit light upon energization thereof; and
   a light conversion structure comprising the photonic crystal phosphor of claim 1 on a light emitting surface of the primary solid state light emitting die.
3. The solid state light emitting device of claim 2, further comprising an adhesive layer that attaches the light conversion structure to the light emitting surface.
4. The solid state light emitting device of claim 3, wherein the adhesive layer comprises silicone polymer.
5. The solid state light emitting device of claim 2, wherein the light conversion structure is sized to fit the light emitting surface of the primary solid state light emitting die.
6. The solid state light emitting device of claim 2, wherein the single crystal of phosphor comprises cerium.
7. The solid state light emitting device of claim 6, wherein the single crystal of phosphor comprises cerium at a concentration in a range of about 0.1 to about 20 weight percent.
8. The solid state light emitting device of claim 6, wherein the single crystal of phosphor comprises $Y_3Al_5O_{12}$ doped with $Ce^{3+}$ Ce:YAG).
9. The solid state light emitting device of claim 6, wherein single crystal of phosphor comprises $Ca_xSr_yMg_{1-x-y}AlSiN_3$ doped with cerium or strontium thio-gallate doped with cerium.
10. The solid state light emitting device of claim 2, wherein the single crystal of phosphor comprises europium.
11. The solid state light emitting device of claim 10, wherein the single crystal of phosphor comprises europium at a concentration in a range of about 0.5 to about 20 weight percent.
12. The solid state light emitting device of claim 10, wherein the single crystal of phosphor comprises $Sr_{2-x}Ba_x SiO_4$ doped with $Eu^{2+}$ (BOSE).
13. The solid state light emitting device of claim 10, wherein the single crystal of phosphor comprises a europium doped material, wherein the material is selected from the group consisting of $Ca_xSr_{1-x}AlSiN_3$, strontium thio-gallate, alpha-SiAlON, silicon garnet, $Y_2O_2S$ and $La_2O_2S$.

14. The solid state light emitting device of claim 2, wherein a surface of the light conversion structure is texturized, roughened, etched and/or featured.

15. The solid state light emitting device of claim 2, wherein the light conversion structure is directly on the light emitting surface of the primary solid state light emitting die.

16. The solid state light emitting device of claim 2, wherein the light conversion structure acts as a substrate for the primary solid state light emitting die.

17. The solid state light emitting device of claim 2, wherein the single crystal of phosphor has a thickness in a range of about 1 µm to about 200 µm.

18. The solid state light emitting device of claim 2, wherein the single crystal of phosphor is spatially separated from the primary solid state light emitting die.

19. The solid state light emitting device of claim 2, further comprising one or more additional solid state light emitting die configured to emit light upon energization thereof.

20. The solid state light emitting device of claim 19, wherein the first portion of the dielectric nanostructures are configured to interact with a first light emitted from the primary solid state light emitting die and the second portion of the dielectric nanostructures are configured to interact with a second light emitted from at least one of the one or more additional solid state light emitting die, wherein the first light has a different wavelength than the second light, and wherein the first light interacts with the first portion of dielectric nanostructures differently than the second light, and wherein the second light interacts with the second portion of dielectric nanostructures differently than the first light.

21. The solid state light emitting device of claim 2, wherein the dielectric nanostructures comprise holes that traverse the single crystal of phosphor in a direction parallel to the light emitting surface of the primary solid state light emitting die.

22. The photonic crystal phosphor of claim 1, wherein the dielectric nanostructures are formed in a periodic array, wherein a period of the periodic array is configured to be half a wavelength of electromagnetic waves propagated through the periodic array.

23. The photonic crystal phosphor of claim 1, wherein the dielectric nanostructures are spaced between 200 nm and 500 nm apart.

24. The photonic crystal phosphor of claim 1, wherein the dielectric nanostructures have a width between 50 nm and 200 nm.

25. The photonic crystal phosphor of claim 1, wherein the first portion of the dielectric nanostructures are configured to interact with a first solid state light emitting die and the second portion of the dielectric nanostructures are configured to interact with a second solid state light emitting die, wherein dielectric nanostructures of the second portion have a size and/or shape different than dielectric nanostructures of the first portion and wherein the second portion of the dielectric nanostructures are dispersed among the first portion of the dielectric nanostructures.

26. A solid state light emitting device comprising:
a primary solid state light emitting die that is configured to emit light upon energization thereof; and
a light conversion structure comprising the photonic crystal phosphor of claim 1 on a light emitting surface of the primary solid state light emitting die, wherein the dielectric nanostructures comprise holes that are parallel to the light emitting surface of the primary solid state light emitting die, and wherein each hole is configured to direct light through the solid phosphor layer in a direction parallel to the light emitting surface of the primary solid state light emitting die.

* * * * *